US012733282B2

(12) United States Patent
Kim et al.

(10) Patent No.: US 12,733,282 B2
(45) Date of Patent: Sep. 8, 2026

(54) IMAGE SENSOR

(71) Applicant: Samsung Electronics Co., Ltd., Suwon-si (KR)

(72) Inventors: Kook Tae Kim, Suwon-si (KR); Jingyun Kim, Suwon-si (KR); Byeongtaek Bae, Suwon-si (KR); Seunghwi Yoo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 645 days.

(21) Appl. No.: 18/310,194

(22) Filed: May 1, 2023

(65) Prior Publication Data

US 2024/0072089 A1 Feb. 29, 2024

(30) Foreign Application Priority Data

Aug. 29, 2022 (KR) ........................ 10-2022-0108618

(51) Int. Cl.
*H10F 39/00* (2025.01)

(52) U.S. Cl.
CPC ......... *H10F 39/807* (2025.01); *H10F 39/024* (2025.01); *H10F 39/802* (2025.01); *H10F 39/8063* (2025.01); *H10F 39/8067* (2025.01); *H10F 39/811* (2025.01)

(58) Field of Classification Search
CPC .. H10F 39/807; H10F 39/024; H10F 39/8063; H10F 39/811; H10F 39/199; H10F 39/8053; H10F 39/8037; H10F 39/8067; H10F 39/80; H10F 39/802–8027
See application file for complete search history.

(56) References Cited

U.S. PATENT DOCUMENTS

| | | | | |
|---|---|---|---|---|
| 5,888,876 | A | 3/1999 | Shiozawa et al. | |
| 6,552,380 | B1 | 4/2003 | Sato et al. | |
| 8,436,440 | B2 | 5/2013 | Marty et al. | |
| 9,190,441 | B2 | 11/2015 | Lai et al. | |
| 9,287,309 | B2 | 3/2016 | Choi et al. | |
| 9,620,546 | B2 | 4/2017 | Chung et al. | |
| 10,079,259 | B2 | 9/2018 | Yu et al. | |
| 2020/0227449 | A1 * | 7/2020 | Kim | H10F 39/807 |
| 2022/0013566 | A1 * | 1/2022 | Kim | H10F 39/807 |

FOREIGN PATENT DOCUMENTS

| | | | |
|---|---|---|---|
| KR | 10-0670606 | B1 | 1/2007 |
| KR | 10-2020-0087544 | A | 7/2020 |
| KR | 10-2022-0005888 | A | 1/2022 |

* cited by examiner

*Primary Examiner* — Yara B Green
*Assistant Examiner* — Benjamin Michael Kupp
(74) *Attorney, Agent, or Firm* — Harness, Dickey & Pierce, P.L.C.

(57) ABSTRACT

An image sensor may include a substrate having a first surface and a second surface, which are opposite to each other, and micro lenses on the second surface, interconnection lines on the first surface, and a pixel isolation portion in the substrate, the pixel isolation portion configured to isolate pixels from direct contact with each other. The pixel isolation portion may include an insulating isolation pattern and a conductive pattern, wherein the conductive pattern is spaced apart from the substrate, and the insulating isolation pattern is between the substrate and the conductive pattern. The conductive pattern may include a sequential arrangement of a first conductive pattern, a second conductive pattern, and a third conductive pattern on a side surface of the insulating isolation pattern.

19 Claims, 16 Drawing Sheets

500
A'
A
EG
APS
FD
ACT
SF UP(1) SEL
UP(2) UP(3)
RG
STI
UP(4)
1a
TG
DTI
14
16
X
Y
Z

FIG. 4

501
A'
A
EG
APS
UP(1)
UP(2)
UP(3)
UP(4)
FD
PD
TG
1a
GP
DTI
14
16
X
Y
Z

FIG. 9

505
CH1
CH2
CH3
EG
APS
UP
BCA
MLR
CFB
56
1b
46
48g
52
54
22
1
1a
CF2
CF1
PD
TG
Gox
FD
17
CP1
CP2
SEL
SF
217
STI3
317
48a
ML
50a
44
24
SP3
SP2
SP1
16
14
12
DTI
STI1
15
IL1
215
IL2
TSV
STI2
SB2
TVL
315
IL3
PTR
SB3

IMAGE SENSOR

CROSS-REFERENCE TO RELATED APPLICATIONS

This U.S. non-provisional patent application claims priority under 35 U.S.C. § 119 to Korean Patent Application No. 10-2022-0108618, filed on Aug. 29, 2022, in the Korean Intellectual Property Office, the entire contents of which are hereby incorporated by reference.

BACKGROUND

The present disclosure relates to an image sensor and a method of fabricating the same.

An image sensor is a semiconductor device converting an optical image to electric signals. The image sensor is classified into two types: a charge coupled device (CCD) type and a complementary metal-oxide-semiconductor (CMOS) type. The CMOS-type image sensor is called CIS for short. The CIS includes a plurality of pixels that are two-dimensionally arranged. Each of the pixels includes a photodiode (PD). The photodiode is used to convert an incident light to an electric signal.

SUMMARY

Some example embodiments of the inventive concepts provide an image sensor capable of realizing a clear image quality.

Some example embodiments of the inventive concepts provide a method of increasing a production yield in a process of fabricating an image sensor.

According to some example embodiments of the inventive concepts, an image sensor may include a substrate having a first surface and a second surface, which are opposite to each other, micro lenses on the second surface, interconnection lines on the first surface, and a pixel isolation portion in the substrate, the pixel isolation portion configured to isolate pixels from direct contact with each other. The pixel isolation portion may include an insulating isolation pattern and a conductive pattern, wherein the conductive pattern is spaced apart from the substrate, and the insulating isolation pattern is between the substrate and the conductive pattern. The conductive pattern may include a sequential arrangement of a first conductive pattern, a second conductive pattern, and a third conductive pattern on a side surface of the insulating isolation pattern.

According to some example embodiments of the inventive concepts, an image sensor may include a substrate having a first surface and a second surface, which are opposite to each other, micro lenses on the second surface, interconnection lines on the first surface, and a pixel isolation portion in the substrate, the pixel isolation portion configured to isolate pixels from direct contact with each other. The pixel isolation portion may include an insulating isolation pattern and a conductive pattern, wherein the conductive pattern is spaced apart from the substrate, and the insulating isolation pattern is between the substrate and the conductive pattern. The conductive pattern may include a sequential arrangement of an outer conductive pattern and an inner conductive pattern on a side surface of the insulating isolation pattern. The outer conductive pattern may include a polycrystalline semiconductor layer containing impurities of a first conductivity type, and the inner conductive pattern may include a substantially intrinsic polycrystalline semiconductor layer.

According to some example embodiments of the inventive concepts, an image sensor may include a substrate having a first surface and a second surface, which are opposite to each other, and including a clockwise arrangement of first to fourth pixels, a backside insulating layer in contact with the second surface, a transfer gate on the first surface of the substrate, in each of the first to fourth pixels, micro lenses on the second surface, an interlayer insulating layer covering the first surface of the substrate, interconnection lines in the interlayer insulating layer, and a pixel isolation portion, which is in the substrate and is between the first to fourth pixels, the pixel isolation portion configured to isolate the first to fourth pixels from direct contact with each other. The pixel isolation portion may include an insulating isolation pattern and a conductive pattern, wherein the conductive pattern is spaced apart from the substrate and the insulating isolation pattern is between the substrate and the conductive pattern. The conductive pattern may include a sequential arrangement of a first conductive pattern, a second conductive pattern, and a third conductive pattern on a side surface of the insulating isolation pattern. A grain size of the second conductive pattern may be larger than a grain size of the third conductive pattern.

BRIEF DESCRIPTION OF THE DRAWINGS

FIG. 4 is a sectional view taken along a line A-A' of FIG. 3.

FIG. 9 is a sectional view illustrating an image sensor according to some example embodiments of the inventive concepts.

DETAILED DESCRIPTION

Figure 1:
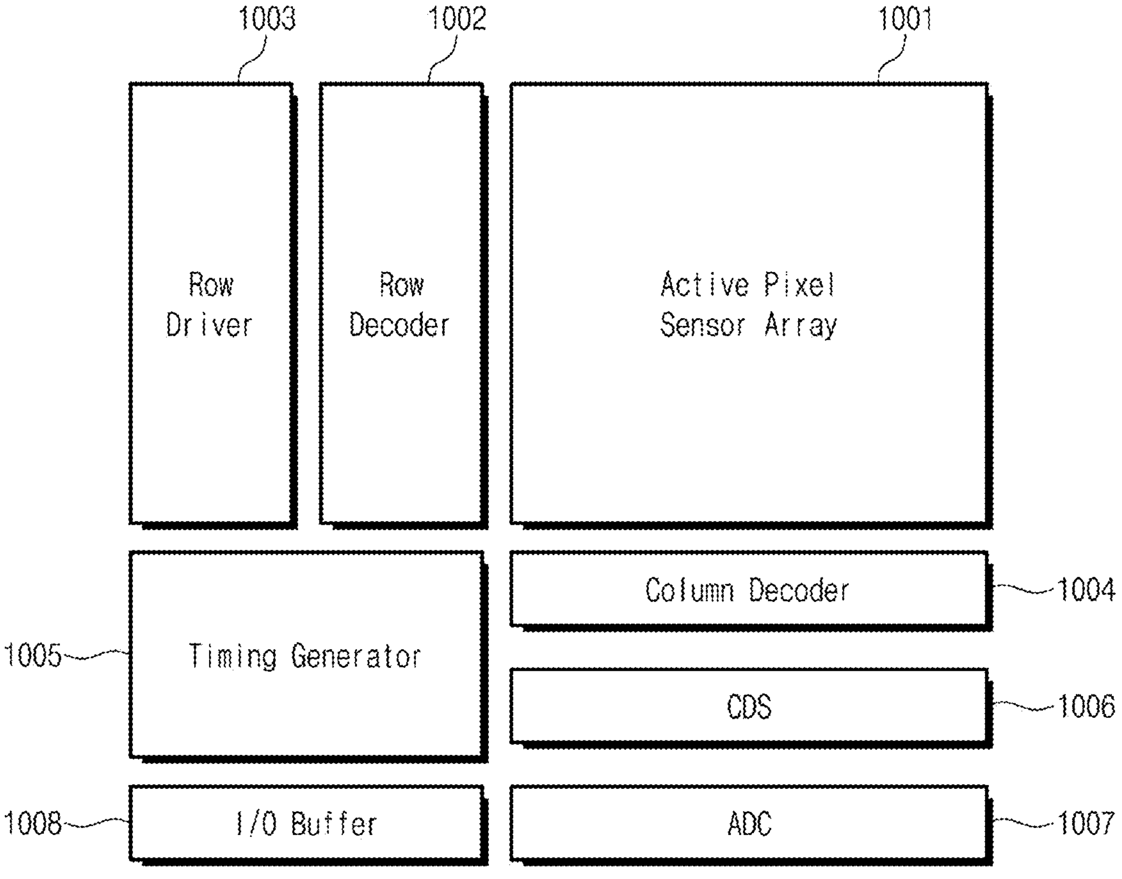
FIG. 1 is a block diagram illustrating an image sensor according to some example embodiments of the inventive concepts.

Some example embodiments of the inventive concepts will now be described more fully with reference to the accompanying drawings, in which some example embodiments are shown. In this specification, terms indicating an order such as first, and second, are used to distinguish components having the same/similar functions as/to each other, and the first and second may be changed depending on an order in which they are mentioned.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 is a block diagram illustrating an image sensor according to some example embodiments of the inventive concepts.

Referring to FIG. 1, an image sensor may include an active pixel sensor array 1001, a row decoder 1002, a row driver 1003, a column decoder 1004, a timing generator 1005, a correlated double sampler (CDS) 1006, an analog-to-digital converter (ADC) 1007, and an input/output (I/O) buffer 1008.

The active pixel sensor array 1001 may include a plurality of unit pixels, which are two-dimensionally arranged, and may be configured to convert an optical signal to an electrical signal. The active pixel sensor array 1001 may be driven by a plurality of driving signals, such as a pixel selection signal, a reset signal, and a charge transfer signal, which are transmitted from the row driver 1003. In addition, the converted electrical signal may be provided to the CDS 1006.

The row driver 1003 may be configured to provide a plurality of driving signals for driving the unit pixels to the active pixel sensor array 1001, based on the result decoded by the row decoder 1002. In the case where the unit pixels are arranged in a matrix shape (i.e., in rows and columns), the driving signals may be provided to respective rows.

The timing generator 1005 may be configured to provide a timing signal and a control signal to the row decoder 1002 and the column decoder 1004.

The CDS 1006 may be configured to receive the electric signals generated by the active pixel sensor array 1001 and to perform a holding and sampling operation on the received electric signals. The CDS 1006 may perform a double sampling operation using a specific noise level and a signal level of the electric signal and then may output a difference level corresponding to a difference between the noise and signal levels.

The ADC 1007 may be configured to convert an analog signal, which contains information on the difference level outputted from the CDS 1006, to a digital signal and to output the converted digital signal.

The I/O buffer 1008 may be configured to latch the digital signals and then to sequentially output the latched digital signals to an image signal processing unit, based on the result decoded by the column decoder 1004.

As described herein, any devices, electronic devices, modules, units, circuits, and/or portions thereof according to any of the example embodiments, and/or any portions thereof (including, without limitation, the image sensor shown in FIG. 1 and/or an electronic device including such an image sensor, the active pixel sensor array 1001, the row decoder 1002, the row driver 1003, the column decoder 1004, the timing generator 1005, the CDS 1006, the ADC 1007, the I/O buffer 1008, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., a CPU) configured to execute the program of instructions to implement the functionality and/or methods performed by some or all of any devices, electronic devices, modules, units, circuits, and/or portions thereof, according to any of the example embodiments, including any of the methods according to any of the example embodiments.

Any of the memories described herein may be a non-transitory computer readable medium and may store a program of instructions. Any of the memories described herein may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM).

Figure 2:
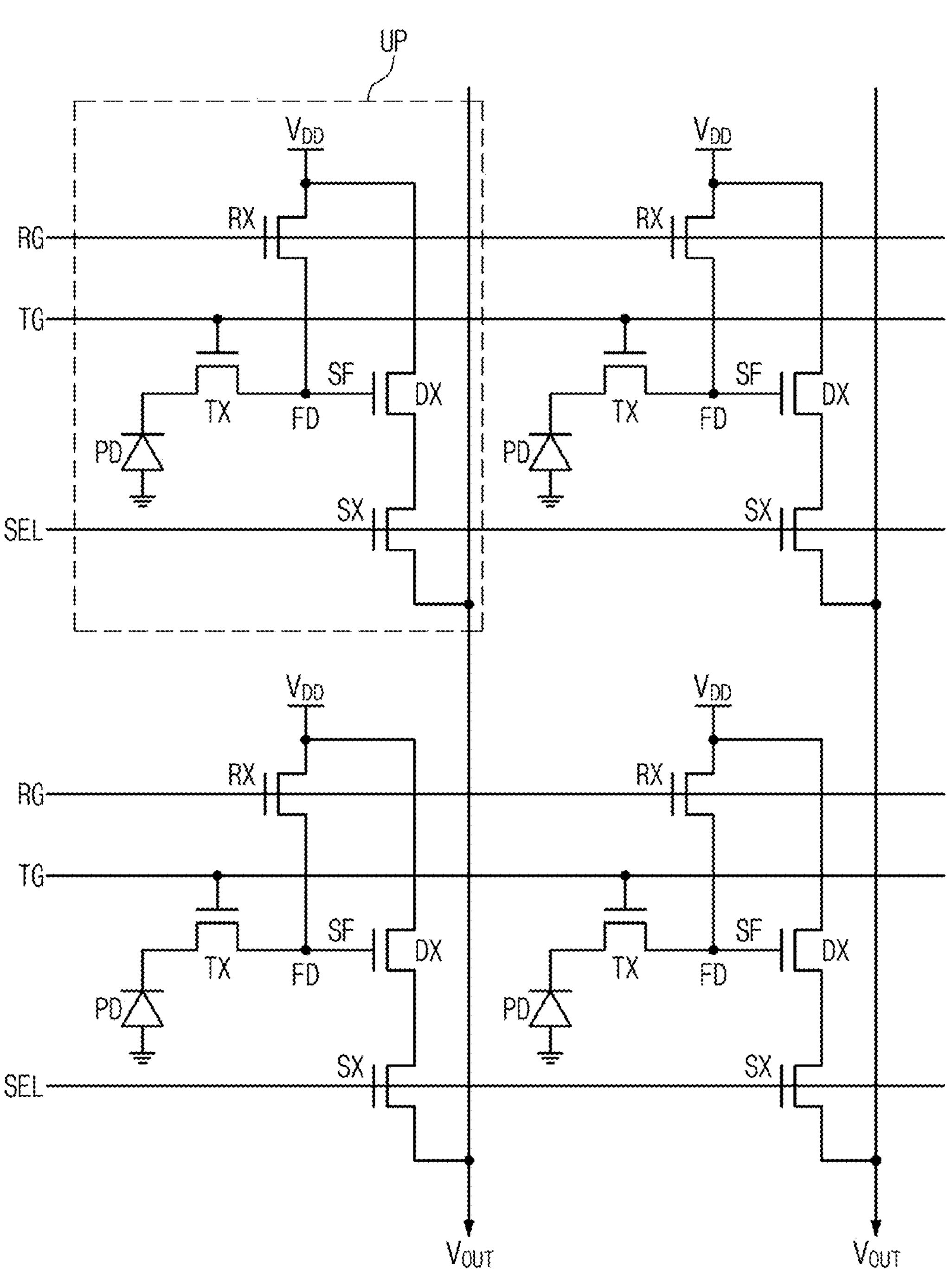
FIG. 2 is a circuit diagram illustrating an active pixel sensor array of an image sensor according to some example embodiments of the inventive concepts.

FIG. 2 is a circuit diagram illustrating an active pixel sensor array of an image sensor according to some example embodiments of the inventive concepts.

Referring to FIGS. 1 and 2, the active pixel sensor array 1001 may include a plurality of unit pixels UP, which are arranged in a matrix shape. Each unit pixel UP may include a transfer transistor TX. Each unit pixel UP may further include logic transistors RX, SX, and DX. The logic transistor may be a reset transistor RX, a selection transistor SX, or a source follower transistor DX. The transfer transistor TX may include a transfer gate TG. Each of the unit pixels UP may further include a photoelectric conversion part PD and a floating diffusion region FD. The logic transistors RX, SX, and DX may be shared by at least two of the unit pixels UP.

The photoelectric conversion part PD may be configured to generate photocharges whose amount is in proportional to an amount of externally incident light and to store the photocharges. The photoelectric conversion part PD may include a photo diode, a photo transistor, a photo gate, a pinned photo diode, or any combination thereof. The transfer transistor TX may be configured to transfer electric charges, which are generated in the photoelectric conversion part PD, to the floating diffusion region FD. The floating diffusion region FD may be configured to receive and cumulatively store the electric charges, which are generated in the photoelectric conversion part PD. The source follower transistor DX may be controlled, based on an amount of photocharges stored in the floating diffusion region FD.

The reset transistor RX may be configured to periodically discharge or reset the photocharges stored in the floating diffusion region FD. The reset transistor RX may include drain and source electrodes, which are connected to the floating diffusion region FD and a power voltage VDD, respectively. If the reset transistor RX is turned on, the power voltage VDD connected to the source electrode of the reset transistor RX may be applied to the floating diffusion region FD. Thus, the reset transistor RX may be turned on, and in this case, the electric charges stored in the floating diffusion region FD may be discharged; that is, the floating diffusion region FD may be reset.

The source follower transistor DX including a source follower gate SF may serve as a source follower buffer amplifier. The source follower transistor DX may be configured to amplify a variation in electric potential of the floating diffusion region FD and to output the amplified signal to an output line Vout.

The selection transistor SX including a selection gate SEL may be used to select one of the rows of the unit pixels UP, during reading operations. If the selection transistor SX is turned on, the power voltage VDD may be applied to a drain electrode of the source follower transistor DX.

Figure 3:
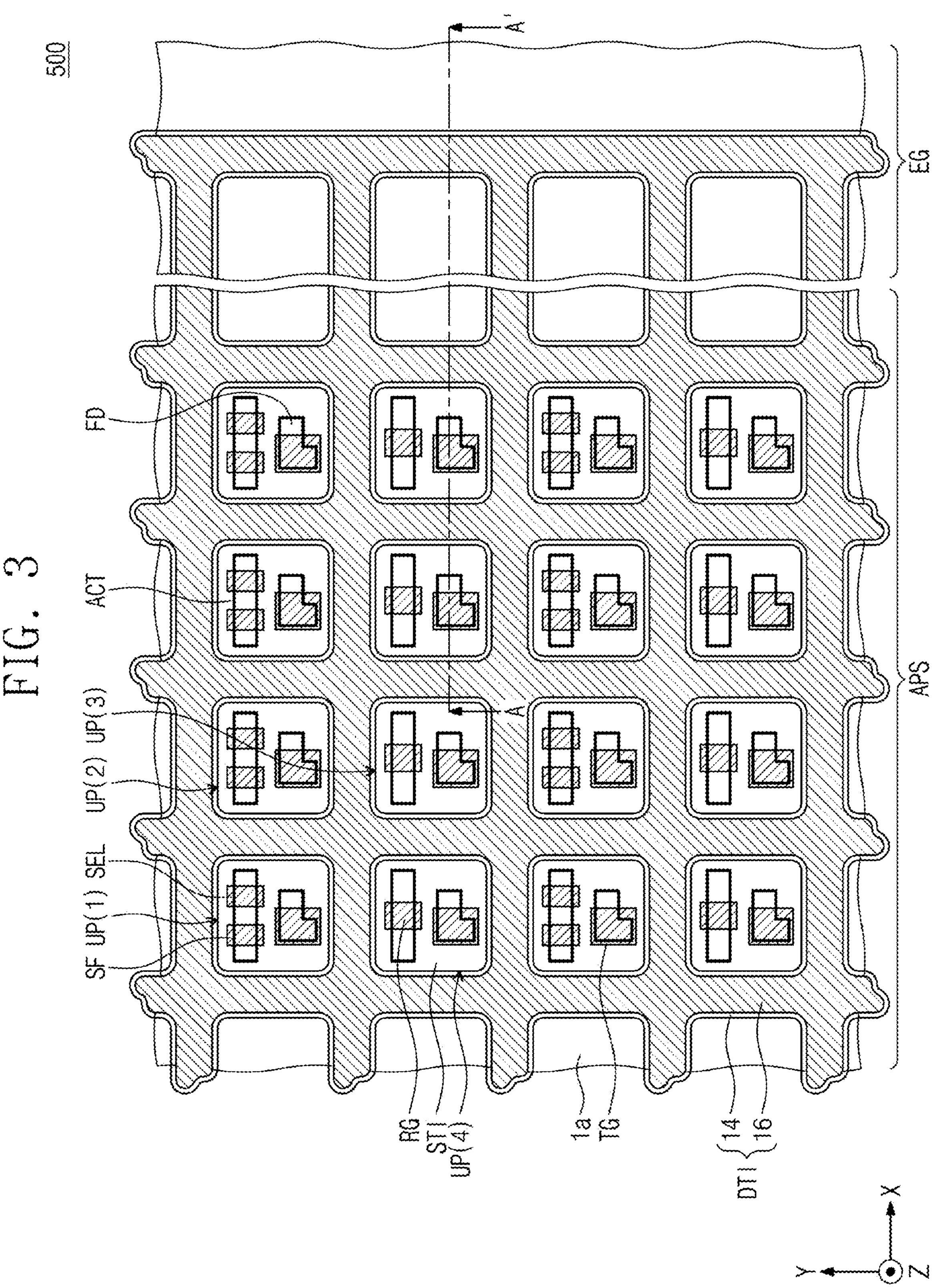
FIG. 3 is a plan view illustrating an image sensor according to some example embodiments of the inventive concepts.
Figure 4:
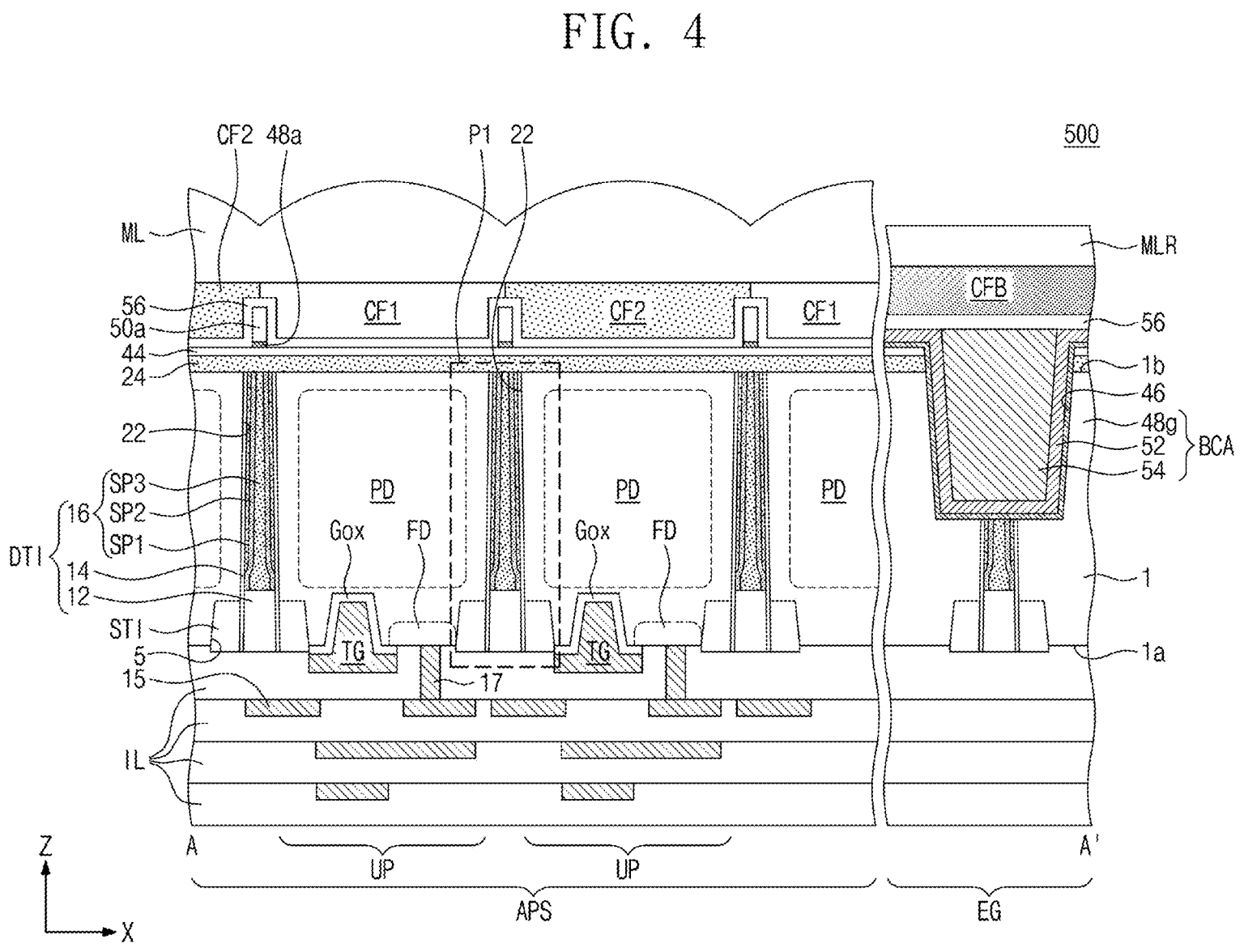
Figure 5A:
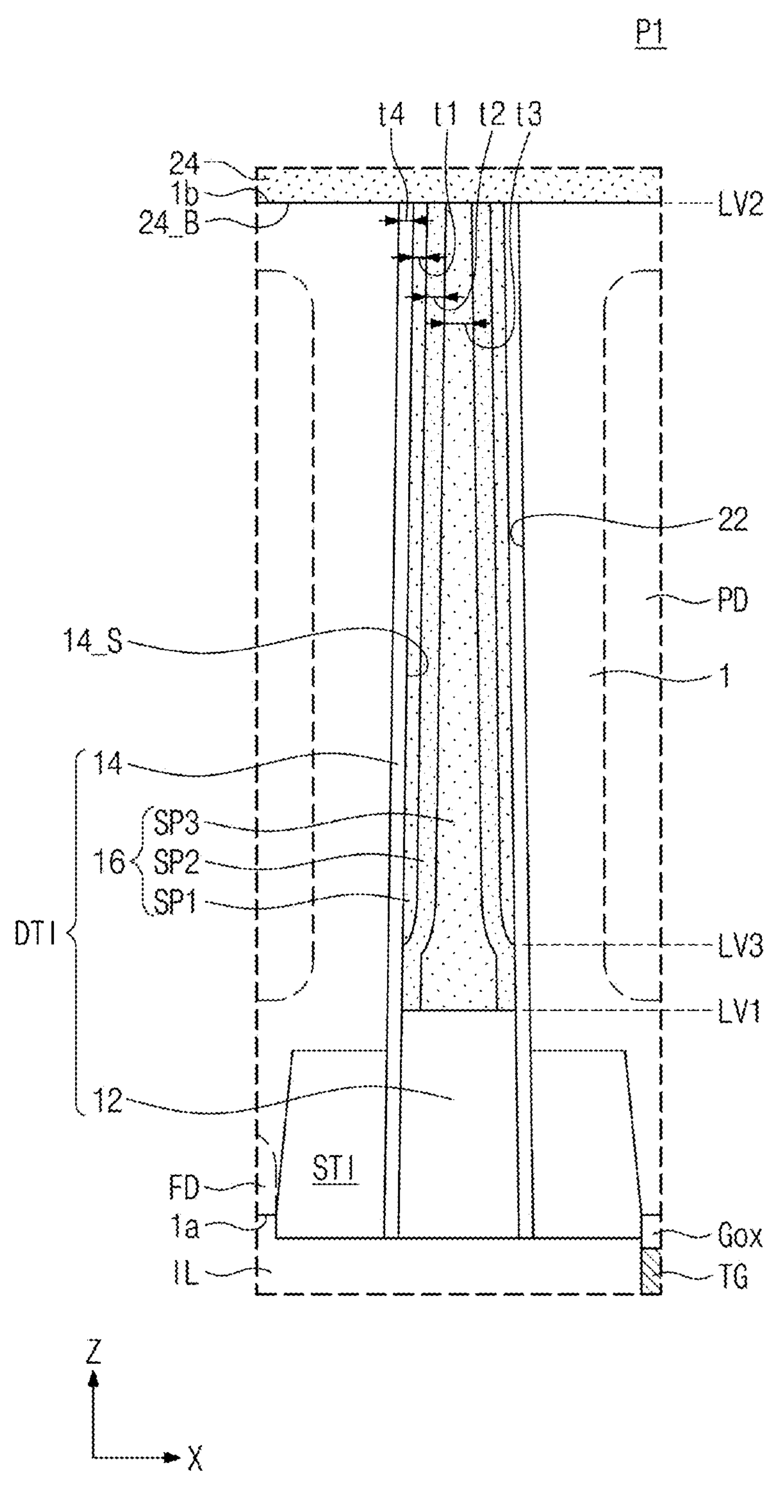
FIGS. 5A and 5B are enlarged sectional views, each of which illustrates a portion (e.g., 'P1' of FIG. 4) of an image sensor according to some example embodiments of the inventive concepts.
Figure 5B:
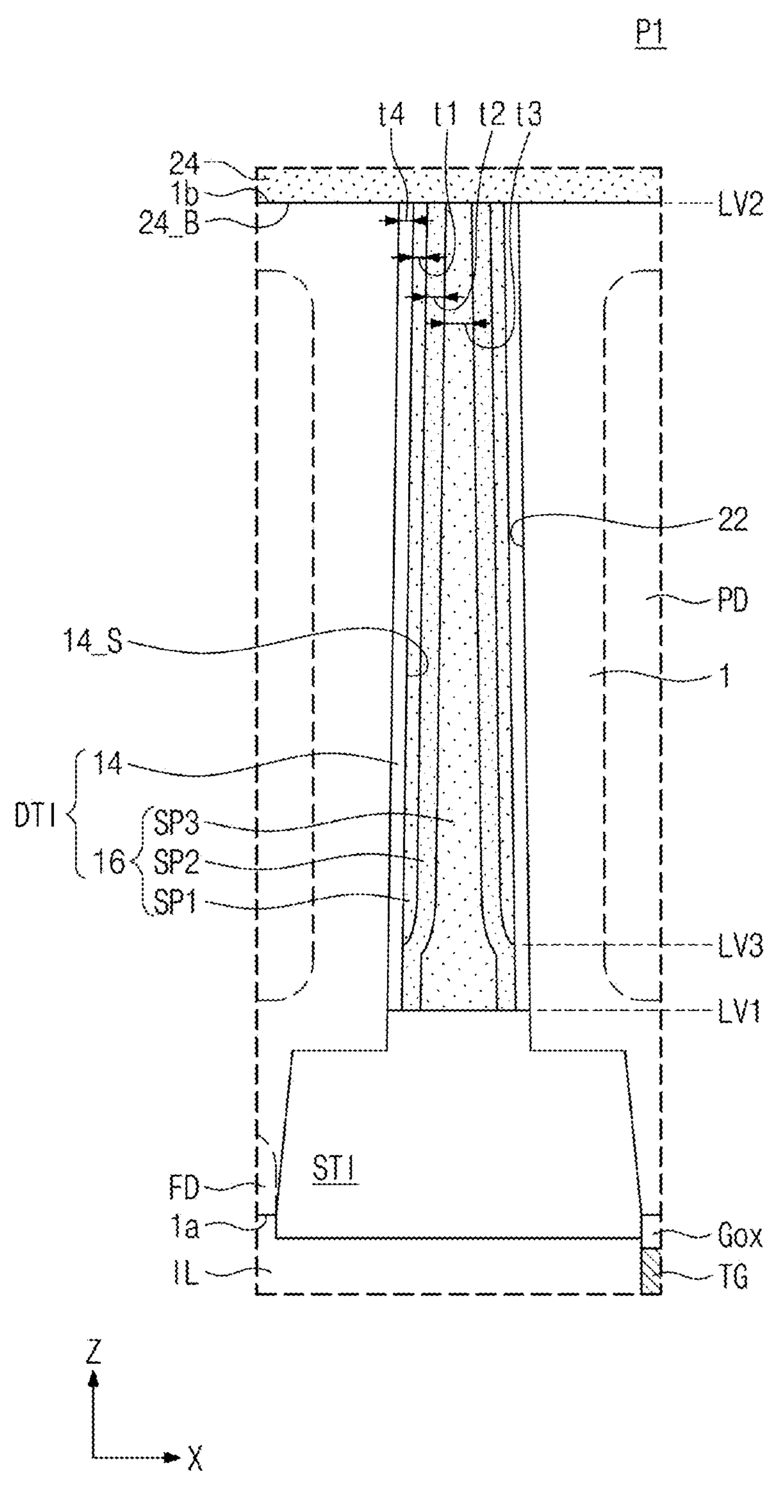

FIG. 3 is a plan view illustrating an image sensor according to some example embodiments of the inventive concepts. FIG. 4 is a sectional view taken along a line A-A' of FIG. 3. FIGS. 5A and 5B are enlarged sectional views, each of which illustrates a portion (e.g., 'P1' of FIG. 4) of an image sensor according to some example embodiments of the inventive concepts.

Referring to FIGS. 3, 4, and 5A, an image sensor 500 according to some example embodiments of the inventive concepts may include a first substrate 1. The first substrate 1 may be, for example, a single-crystalline silicon wafer, a silicon epitaxial layer, or a silicon-on-insulator (all) wafer. In some example embodiments, the first substrate 1 may be doped with impurities of a first conductivity type. For example, the first conductivity type may be a p type. The first substrate 1 may include a first surface 1*a* and a second surface 1*b*, which are opposite to each other. In the present specification, the first surface 1*a* may be a front side of the first substrate 1, and the second surface 1*b* may be a rear or backside surface of the first substrate 1. Micro lenses to be described below may be provided on the second surface 1*b*, and interconnection lines to be described may be provided on the first surface 1*a*.

The first substrate 1 may include a pixel array region APS and an edge region EG. The pixel array region APS may include a plurality of unit pixels UP. The edge region EG may correspond to a portion of an optical black region OB of FIG. 9.

A pixel isolation portion DTI may be disposed in the first substrate 1 to define or delimit (e.g., isolate) the unit pixels UP in the pixel array region APS from each other (e.g., isolate separate unit pixels UP from direct contact with each other in the first direction X and/or the second direction Y). The pixel isolation part DTI may be located within the first substrate 1 (e.g., at least partially or entirely within an interior of the first substrate 1 between the first and second surfaces 1*a* and 1*b* of the first substrate 1) As shown in at least FIG. 3, the pixel isolation portion DTI may be extended to the edge region EG. The pixel isolation portion DTI may have a grid shape, when viewed in a plan view.

The pixel isolation portion DTI may be placed in (e.g., within) a first trench 22, which is formed to extend from the first surface 1*a* of the first substrate 1 toward the second surface 1*b* (e.g., at least partially defined by one or more inner surfaces of the first substrate 1 which extend from the first surface 1*a* toward the second surface 1*b*). The first trench 22 may be extended in a third direction Z, which is not parallel (e.g., is perpendicular) to a first direction X and a second direction Y. The pixel isolation portion DTI may include an insulating gapfill pattern 12, an insulating isolation pattern 14, and a conductive pattern 16. The conductive pattern 16 may be spaced apart from the first substrate 1. The insulating gapfill pattern 12 may be interposed between (e.g., between in the third direction Z) the conductive pattern 16 and a first interlayer insulating layer IL. The insulating isolation pattern 14 may be interposed between (e.g., between in the first direction X and/or the second direction Y) the conductive pattern 16 and the first substrate 1 and between (e.g., between in the first direction X and/or the second direction Y) the insulating gapfill pattern 12 and the first substrate 1. For example, as shown, the insulating isolation pattern 14 may surround (e.g., in the first direction X and/or the second direction Y), and may contact, respective sidewalls of the conductive pattern 16 and the insulating gapfill pattern 12 and is simultaneously in contact with (e.g., in contact with both of) the backside insulating layer 24 (e.g., the bottom surface 24_B of the backside insulating layer 24) and the first interlayer dielectric layer IL. As shown in FIGS. 4 and 5A, the pixel isolation portion DTI may have a width (e.g., a width in the first direction X and/or the second direction Y) that decreases as a distance from the first surface 1*a* of the first substrate 1 increases in a direction toward the second surface 1*b* (e.g., in the third direction Z). In the present specification, the term 'width' may be replaced with a term 'thickness' in a specific direction.

As shown, the first direction X may be understood to extend parallel to (e.g., extend in parallel with) at least one of the first surface 1*a* or the second surface 1*b* of the first substrate 1 and in some example embodiments may be referred to as extending parallel to the first substrate 1 based on extending parallel to at least one of the first surface 1*a* or the second surface 1*b* of the first substrate 1. As further shown, the second direction Y may be understood to extend parallel to (e.g., extend in parallel with) at least one of the first surface 1*a* or the second surface 1*b* of the first substrate 1 (in addition to intersecting the first direction X, which may include extending perpendicular to the first direction X), and in some example embodiments may be referred to as extending parallel to the first substrate 1 based on extending parallel to at least one of the first surface 1*a* or the second surface 1*b* of the first substrate 1.

The insulating gapfill pattern 12 and the insulating isolation pattern 14 may be formed of or include (e.g., may comprise) an insulating material whose refractive index is different from the first substrate 1. For example, the insulating gapfill pattern 12 and the insulating isolation pattern 14 may be formed of or include at least one of silicon oxide, silicon nitride, and silicon oxynitride. The conductive pattern 16 may be spaced apart from (e.g., isolated from direct contact with) the first substrate 1 with the insulating isolation pattern 14 interposed therebetween.

The conductive pattern 16 and the insulating gapfill pattern 12 may be in contact with each other at a first level LV1. A top surface of the insulating isolation pattern 14 and a top surface of the conductive pattern 16 may be in contact with a bottom surface 24_B of a backside insulating layer 24 at a second level LV2.

In the present specification, the term 'level', 'vertical level', 'depth', 'height', or the like may mean a vertical height (e.g., vertical distance in the third direction Z) measured from a reference location (e.g., the first surface 1*a* and/or the second surface 1*b* of the first substrate 1) in a direction perpendicular to the plane or surface at the reference location (e.g., the third direction Z, which may be a vertical direction perpendicular to the first surface 1*a* and/or the second surface 1*b* of the first substrate 1). For example, where elements (e.g., surfaces) are described herein to be at different levels, it will be understood that the respective distances of the elements from the reference location (e.g., the first surface 1*a* of the first substrate 1) in the vertical direction (e.g., third direction Z) may be different from each other. In another example, where a level of a first element is described herein to be between at least two other elements, it will be understood that the first element is between the at least two other elements in the vertical direction. In another example, where a level of a first element is described herein to be lower, less, or smaller than a level of a second element, it will be understood that the distance of the first element from the reference location (e.g., the first surface 1*a* of the first substrate 1) in the vertical direction may be smaller than the distance of the second element from the reference location in the vertical direction. In another example, where a level of a first element is described herein to be higher, larger, or greater than a level of a second element, it will be understood that the distance of the first element from the reference location (e.g., the first surface 1*a* of the first substrate 1) in the vertical direction may be greater than the distance of the second element from the reference location in the vertical direction. In another example, where a level of a first element is described herein to be the same or substantially the same as a level of a second element or "at" the level of the second element, it will be understood that the distance of the first element from the reference location (e.g., the first surface 1*a* of the first substrate 1) in the vertical direction may be the same or substantially the same as the distance of the second element from the reference location in the vertical direction. In some example embodiments, a 'height' of an element may refer to a dimension of the element in the vertical direction (e.g., length of the element between opposing top/bottom surfaces of the element in the vertical direction). The vertical direction as described herein may be the third direction Z which may be perpendicular to both the first and second directions X and Y.

The conductive pattern 16 may include a first conductive pattern SP1, a second conductive pattern SP2, and a third conductive pattern SP3. The first conductive pattern SP1 may be referred to as an outer conductive pattern, and the second and third conductive patterns SP2 and SP3 may be referred to (individually or collectively) as an inner conductive pattern.

The first, second, and third conductive patterns SP1, SP2, and SP3 may be sequentially provided on a side surface 14_S of the insulating isolation pattern 14. For example, as shown, the conductive pattern may include a sequential arrangement of the first, second, and third conductive patterns SP1, SP2, and SP3 on the side surface 14_S (e.g., an inner side surface) of the insulating isolation pattern 14. In some example embodiments, the first conductive pattern SP1 may be in contact with the side surface of the insulating isolation pattern 14, the third conductive pattern SP3 may be spaced apart from the first conductive pattern SP1, and the second conductive pattern SP2 may be provided between the first conductive pattern SP1 and the third conductive pattern SP3.

A second thickness t2 of the second conductive pattern SP2 may be larger than a first thickness t1 of the first conductive pattern SP1. A third thickness t3 of the third conductive pattern SP3 may be larger than the second thickness t2. A fourth thickness t4 of the insulating isolation pattern 14 may be larger than the first thickness t1 and may be larger than the second thickness t2. As an example, the first thickness t1 of the first conductive pattern SP1 may range from about 3 nm to about 15 nm. As an example, the second thickness t2 of the second conductive pattern SP2 may range from about 5 nm to about 40 nm. As an example, the third thickness t3 of the third conductive pattern SP3 may range from about 50 nm to about 150 nm. Each of the first to fourth thicknesses t1 to t4 may be a thickness that is measured in the first direction X parallel to the first surface 1*a* of the first substrate 1. Each of the first to fourth thickness t1 to t4 may be a thickness that is measured at an intermediate level between the first and second levels LV1 and LV2.

The first, second, and third conductive patterns SP1, SP2, and SP3 may have top surfaces, which are in contact with the bottom surface 24_B of the backside insulating layer 24 at the same level (e.g., the second level LV2) as the second surface 1*b* of the first substrate 1. As shown, the level LV2 of the bottom surface 24_B of the backside insulating layer 24 may be the same as the level of the second surface 1*b* of the first substrate 1. Bottom surfaces of the second and third conductive patterns SP2 and SP3 may be in contact with the insulating gapfill pattern 12. A bottom surface of the first conductive pattern SP1 may be spaced apart from the insulating gapfill pattern 12. Accordingly, as shown in at least FIG. 5A, a top surface of the insulating gapfill pattern 12 may be connected to the second and third conductive patterns SP2 and SP3 and spaced apart from the first conductive pattern SP1. For example, the bottom surface of the first conductive pattern SP1 may be located at a third level LV3 that is higher than the first level LV1. The second conductive pattern SP2 may be extended to a region between the bottom surface of the first conductive pattern SP1 and the insulating gapfill pattern 12 and may be in contact with the insulating isolation pattern 14. A lower portion of the second conductive pattern SP2 may have a decreasing thickness as a distance to the insulating gapfill pattern 12 (e.g., a distance in the third direction Z) decreases. The insulating gapfill pattern 12 may be in contact with an inner side surface of the insulating isolation pattern 14.

The conductive pattern 16 may be formed of or include a polycrystalline semiconductor material. In some example embodiments, the conductive pattern 16 may include a poly-silicon layer or a silicon germanium layer. The first conductive pattern SP1 may include a polycrystalline semiconductor layer containing impurities of a first conductivity type. As an example, the first conductive pattern SP1 may be a poly-silicon layer that is doped with boron (B). In some example embodiments, the first conductive pattern SP1 may include a polycrystalline semiconductor layer containing impurities of a second conductivity type. As an example, the first conductive pattern SP1 may be a poly-silicon layer that is doped with phosphorus (P) or arsenic (As). The second and third conductive patterns SP2 and SP3 may include a substantially intrinsic polycrystalline semiconductor layer, which may be a semiconductor layer that is an intrinsic polycrystalline semiconductor layer within manufacturing and/or material tolerances. As described herein, a "substantially" intrinsic polycrystalline layer may be understood to refer to a layer that is (or was) intentionally not doped with dopants (e.g., not doped with any dopants) at the time of manufacture of the layer, but may contain dopants due to subsequent diffusion from the adjacent layers (e.g., subsequent diffusion of one or more dopants into the layer from one or more adjacent layers subsequent to the manufacture of the layer).

A grain size of the second conductive pattern SP2 may be larger than a grain size of the third conductive pattern SP3. For example, where the second conductive pattern SP2 and the third conductive pattern SP3 are collectively referred to as an inner conductive pattern, a grain size of the inner conductive pattern may be larger at a position close to the outer conductive pattern (e.g., at the second conductive pattern SP2 which is closer to the first conductive pattern SP1 than the third conductive pattern SP3) than at a position far from the outer conductive pattern (e.g., at the third conductive pattern SP3 which is further from the first conductive pattern SP1 than the second conductive pattern SP2). The grain size of the second conductive pattern SP2 may be about 2 times to about 4 times the grain size of the third conductive pattern SP3. A grain size of the first conductive pattern SP1 may be smaller than the grain size of the second conductive pattern SP2. In other words, the grain size of the second conductive pattern SP2 may be larger than the grain size of the first conductive pattern SP1. The grain size of the second conductive pattern SP2 may be about 1.5 times to about 6 times the grain size of the first conductive pattern SP1. As an example, the grain size of the first conductive pattern SP1 may range from about 6 nm to about 19 nm. The grain size of the second conductive pattern SP2 may range from about 15 nm to about 50 nm. The grain size of the third conductive pattern SP3 may range from about 8 nm to about 19 nm. The grain sizes of the first, second, and third conductive patterns SP1, SP2, and SP3 may be calculated by measuring a full width half maximum (FWHM) through an X-ray diffraction analysis and then applying the Scherrer equation to the measured data.

The image sensor 500 according to some example embodiments of the inventive concepts may include the pixel isolation portion DTI including the first, second, and third conductive patterns SP1, SP2, and SP3, and in this case, it may be possible to reduce, minimize, prevent or suppress a void from being formed in the pixel isolation portion DTI, for example based on the arrangement, the difference in thickness, and/or the difference in grain size between the first, second, and third conductive patterns SP1, SP2, and SP3. Accordingly, it may be possible to uniformly apply a negative bias (also referred to herein as a negative bias voltage) to the conductive pattern 16 without a position-dependent variation (e.g., without or substantially without variation of the negative bias in different positions in the conductive pattern 16) and thereby to suppress a dark current issue, thereby improving operational performance of the image sensor 500 due to suppressed dark current in the image sensor 500 as a result of the image sensor 500 including the pixel isolation portion DTI including the first, second, and third conductive patterns SP1, SP2, and SP3 and the resultant reduction, minimization, prevention, or suppression of void formation in the pixel isolation portion DTI. In addition, since a rear strength of a module in a product (e.g., a product including the image sensor 500) is increased for example based on the arrangement, the difference in thickness, and/or the difference in grain size between the first, second, and third conductive patterns SP1, SP2, and SP3 in the image sensor 500, a final yield of manufactured products that include image sensors 500 in a manufacturing process may be increased, thereby improving performance and/or efficiency of a manufacturing process to manufacture image sensors comprising image sensors 500, based on a reduced likelihood of structural failure of the image sensor 500 being manufactured in such a manufacturing process due to manufacturing defects.

Photoelectric conversion parts PD may be disposed in the unit pixels UP, respectively, and in the first substrate 1. The photoelectric conversion parts PD may be doped with impurities, which are of a second conductivity type different from the first conductivity type. The second conductivity type may be, for example, an n type. The photoelectric conversion part PD doped with the n-type impurities may form a pn junction, which is used as a photodiode, in conjunction with the first substrate 1 doped with the p-type impurities.

Device isolation portions STI may be disposed in regions of the first substrate 1 adjacent to the first surface 1*a*. The device isolation portions STI may be pierced by the pixel isolation portion DTI. In each unit pixel UP, the device isolation portion STI may delimit an active region ACT, which is formed near the first surface 1*a*. The active regions ACT may be provided for the transistors TX, RX, DX, and SX of FIG. 2.

The transfer gate TG in each unit pixel UP may be disposed on the first surface 1*a* of the first substrate 1. A portion of the transfer gate TG may be extended into the first substrate 1. The transfer gate TG may be of a vertical type. In some example embodiments, the transfer gate TG may be of a planar type; for example, the transfer gate TG may not be extended into the first substrate 1 and may have a flat shape. A gate insulating layer Gox may be interposed between the transfer gate TG and the first substrate 1. A floating diffusion region FD may be formed in a portion of the first substrate 1, which is located at a side of the transfer gate TG. In some example embodiments, the floating diffusion region FD may be doped with impurities of the second conductivity type.

The image sensor 500 may be a back-side light-receiving image sensor. Light may be incident into the first substrate 1 through the second surface 1*b* of the first substrate 1. Electron-hole pairs may be generated in the pn junction by the incident light. The electrons produced by this process may be transferred to the photoelectric conversion part PD. If a voltage is applied to the transfer gate TG, the electrons may be transferred to the floating diffusion region FD.

As shown in FIG. 3, the unit pixels UP may include first to fourth unit pixels UP(1) to UP(4), which are disposed in a clockwise direction to be adjacent to each other. Accordingly, the unit pixels UP, and thus the first substrate 1, may be understood to include a clockwise arrangement of first to fourth unit pixels UP(1) to UP(4). The first and second pixels UP(1) and UP(2) may be arranged in the first direction X. The fourth and third pixels UP(4) and UP(3) may be arranged in the first direction X. The fourth and first pixels UP(4) and UP(1) may be arranged in the second direction Y crossing the first direction X. The third and second pixels UP(3) and UP(2) may be arranged in the second direction Y.

In each of the third and fourth unit pixels UP(3) and UP(4), a reset gate RG may be disposed on the first surface 1*a* and adjacent to the transfer gate TG. In each of the first and second unit pixels UP(1) and UP(2), the source follower gate SF and the selection gate SEL may be disposed on the first surface 1*a* and adjacent to the transfer gate TG. The gates TG, RG, SF, and SEL may correspond to gates of the transistors TX, RX, DX, and SX, respectively, of FIG. 2. The gates TG, RG, SF, and SEL may be overlapped (e.g., in the third direction Z) with the active regions ACT. In some example embodiments, the reset transistor RX, the selection transistor SX, and the source follower transistor DX may be shared by two adjacent ones of the unit pixels UP (e.g., two adjacent unit pixels UP).

The first surface 1*a* may be covered with first interlayer insulating layers IL. The first interlayer insulating layers IL may be a single layer or a plurality of layers, each of which is formed of at least one of silicon oxide, silicon nitride, silicon oxynitride, porous low-k dielectric materials. First interconnection lines 15 may be formed between or in the first interlayer insulating layers IL. The floating diffusion region FD may be connected to the first interconnection line 15 through a first contact plug 17. The first contact plug 17 may be provided in the pixel array region APS to penetrate the first interlayer insulating layer IL, which is the lowermost one of the first interlayer insulating layers IL and is closest to the first surface 1*a*.

The backside insulating layer 24 may be disposed on the second surface 1*b* of the first substrate 1. The backside insulating layer 24 may be in contact with the second surface

1*b* of the first substrate 1. The backside insulating layer 24 may include at least one of a bottom antireflective coating (BARC) layer, a fixed charge layer, an adhesive layer, or a protection layer. The backside insulating layer 24 may include a metal oxide layer whose oxygen content is lower than its stoichiometric ratio or a metal fluoride layer whose fluorine content ratio is lower than its stoichiometric ratio and may have a single or multi-layered structure. Thus, the fixed charge layer may have negative fixed charges. The backside insulating layer 24 may be formed of at least one of metal oxides or metal fluorides containing at least one metallic element that is selected from the group consisting of hafnium (Hf), zirconium (Zr), aluminum (Al), tantalum (Ta), titanium (Ti), yttrium (Y), and lanthanoid and may have a single- or multi-layered structure. In some example embodiments, the backside insulating layer 24 may include a hafnium oxide layer and/or an aluminum oxide layer. The backside insulating layer 24 may suppress dark-current and white-spot issues in the image sensor 500.

A first protection layer 44 may be stacked on the backside insulating layer 24. The first protection layer 44 may be formed of or include at least one of PETEOS, SiOC, $SiO_2$, or SiN. The first protection layer 44 may be used as an anti-reflection layer and/or a planarization layer.

In the case where the device isolation portion STI, the insulating isolation pattern 14, and the insulating gapfill pattern 12 are formed of the same material (e.g., silicon oxide), there may be no observable interface or boundary between the device isolation portion STI, the insulating isolation pattern 14, and the insulating gapfill pattern 12. In this case, the device isolation portion STI, the insulating isolation pattern 14, and the insulating gapfill pattern 12 may be observed as a single object. For example, the device isolation portion STI may be observed to have a shape of letter 'T', as shown in FIG. 5B.

The insulating isolation pattern 14 may have a single-layered structure, as shown in FIG. 5A. In some example embodiments, the insulating isolation pattern 14 may include first to third insulating isolation patterns sequentially stacked. The second insulating isolation pattern may be formed of or include an insulating material, which has a dielectric constant different from the first and third insulating isolation patterns. For example, the second insulating isolation pattern may be formed of or include silicon nitride, and the first and third insulating isolation patterns may be formed of or include silicon oxide.

Referring to FIG. 4, in the edge region EG, a connection contact BCA may penetrate the first protection layer 44, the backside insulating layer 24, and a portion of the first substrate 1 and may be in contact with the conductive pattern 16 and the insulating isolation pattern 14. The connection contact BCA may be placed in a third trench 46. The connection contact BCA may include a diffusion preventing pattern 48*g*, which is provided to conformally cover an inner side surface and a bottom surface of the third trench 46, a first metal pattern 52, which is provided on the diffusion preventing pattern 48*g*, and a second metal pattern 54, which is provided to fill the third trench 46. The diffusion preventing pattern 48*g* may be formed of or include, for example, titanium. The first metal pattern 52 may be formed of or include, for example, tungsten. The second metal pattern 54 may be formed of or include, for example, aluminum. The diffusion preventing pattern 48*g* and the first metal pattern 52 may be extended to a region on the first protection layer 44 and may be electrically connected to other interconnection lines or via/contact plugs.

Light-blocking patterns 48*a* may be disposed in the pixel array region APS and on the first protection layer 44. Low refractive patterns 50*a* may be formed on the light-blocking patterns 48*a*, respectively. When viewed in a plan view, the light-blocking pattern 48*a* and the low refractive pattern 50*a* may be overlapped with the pixel isolation portion DTI and may have a grid shape. The light-blocking pattern 48*a* may be formed of or include, for example, titanium. The low refractive pattern 50*a* may have a refractive index that is lower than color filters CF1 and CF2. For example, the low refractive pattern 50*a* may have a refractive index of about 1.3 or lower. The light-blocking pattern 48*a* and the low refractive pattern 50*a* may reduce, minimize, or prevent a cross-talk issue between adjacent ones of the unit pixels UP, thereby improving performance of the image sensor 500.

A second protection layer 56 may be stacked on the first protection layer 44. The second protection layer 56 may be provided to conformally cover the light-blocking pattern 48*a*, the low refractive pattern 50*a*, and the connection contact BCA. The color filters CF1 and CF2 may be disposed in the pixel array region APS and between the low refractive patterns 50*a*. Each of the color filters CF1 and CF2 may have one color of blue, green, and red. In some example embodiments, the color filters CF1 and CF2 may be provided to have other colors, such as cyan, magenta, or yellow.

In the image sensor according to some example embodiments, the color filters CF1 and CF2 may be arranged in the shape of the Bayer pattern. In some example embodiments, the color filters CF1 and CF2 may be arranged in the 2×2, 3×3, or 4×4 arrangement shape.

A first optical black pattern CFB may be disposed in the edge region EG and on the second protection layer 56. For example, the first optical black pattern CFB may be formed of or include the same material as a blue color filter.

Micro lenses ML may be disposed in the pixel array region APS and on the color filters CF1 and CF2. Edge portions of the micro lenses ML may be in contact with each other and may be connected to each other.

A residual lens layer MLR may be disposed in the edge region EG and on the first optical black pattern CFB. The residual lens layer MLR may be formed of or include the same material as the micro lenses ML.

A negative bias voltage may be applied to the conductive patterns 16 through the connection contact BCA. The conductive patterns 16 may serve as a common bias line. Accordingly, it may be possible to improve a dark-current issue which may be caused by holes on a surface of the first substrate 1 in contact with the pixel isolation portions DTI.

Figure 6:
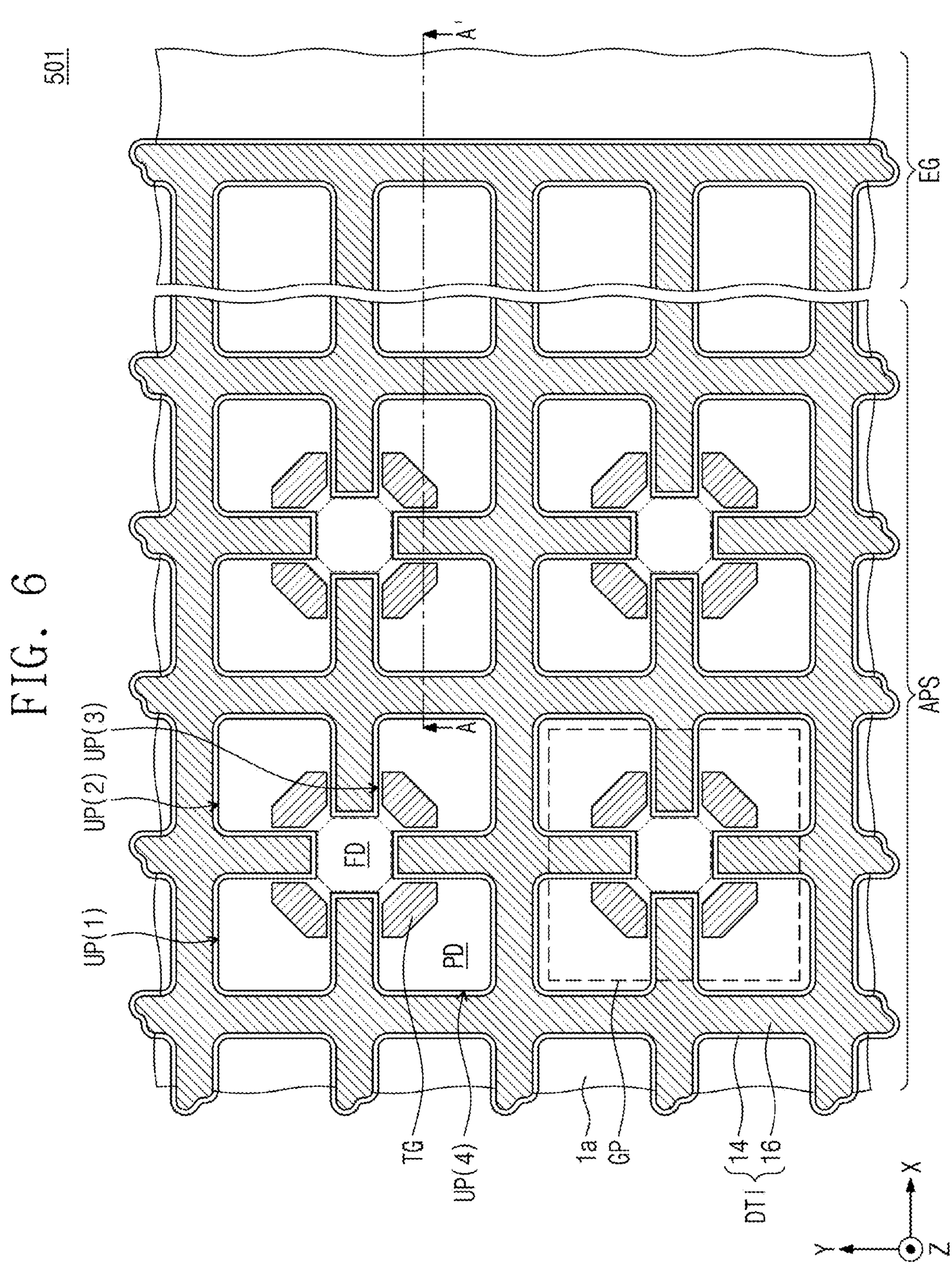
FIG. 6 is a plan view illustrating an image sensor according to some example embodiments of the inventive concepts.

FIG. 6 is a plan view illustrating an image sensor according to some example embodiments of the inventive concepts. A cross-section taken along a line A-A' of FIG. 6 may be the same or similar to that in FIG. 4.

Referring to FIG. 6, in an image sensor 501 according to some example embodiments, first to fourth unit pixels UP(1) to UP(4), which are sequentially arranged in a clockwise direction, may constitute a single pixel group GP. The pixel isolation portion DTI may not be disposed at a center of the pixel group GP. The floating diffusion region FD may be disposed at the center of the pixel group GP. The transfer gates TG may be respectively formed in the first to fourth unit pixels UP(1) to UP(4) to be adjacent to the floating diffusion region FD. The first to fourth unit pixels UP(1) to UP(4) constituting each pixel group GP may share one floating diffusion region FD. Although not shown, one color filter and one micro lens may be disposed on one pixel group GP. Except for the afore-described features, the image sensor of FIG. 6 may have substantially the same or similar features as that described with reference to FIGS. 3 to 5B.

Figure 7:
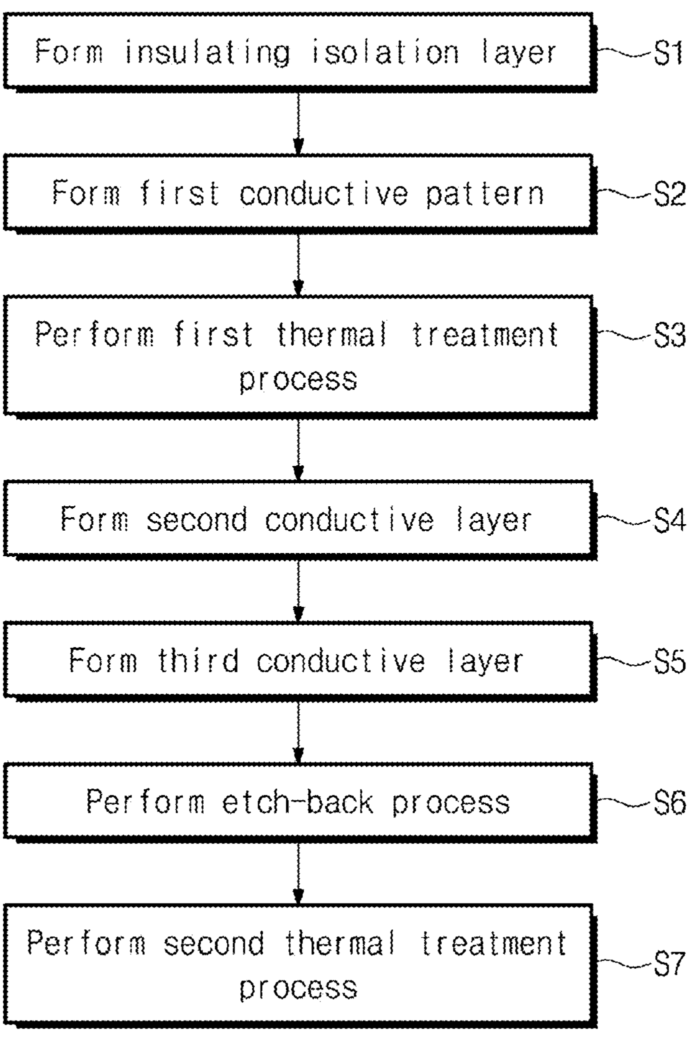
FIG. 7 is a flow chart illustrating a process of fabricating an image sensor, according to some example embodiments of the inventive concepts.

FIG. 7 is a flow chart illustrating a process of fabricating an image sensor, according to some example embodiments of the inventive concepts. FIGS. 8A, 8B, 8C, 8D, 8E, and 8F are sectional views sequentially illustrating a method of fabricating an image sensor (e.g., having the sectional structure of FIG. 4).

Figure 8A:
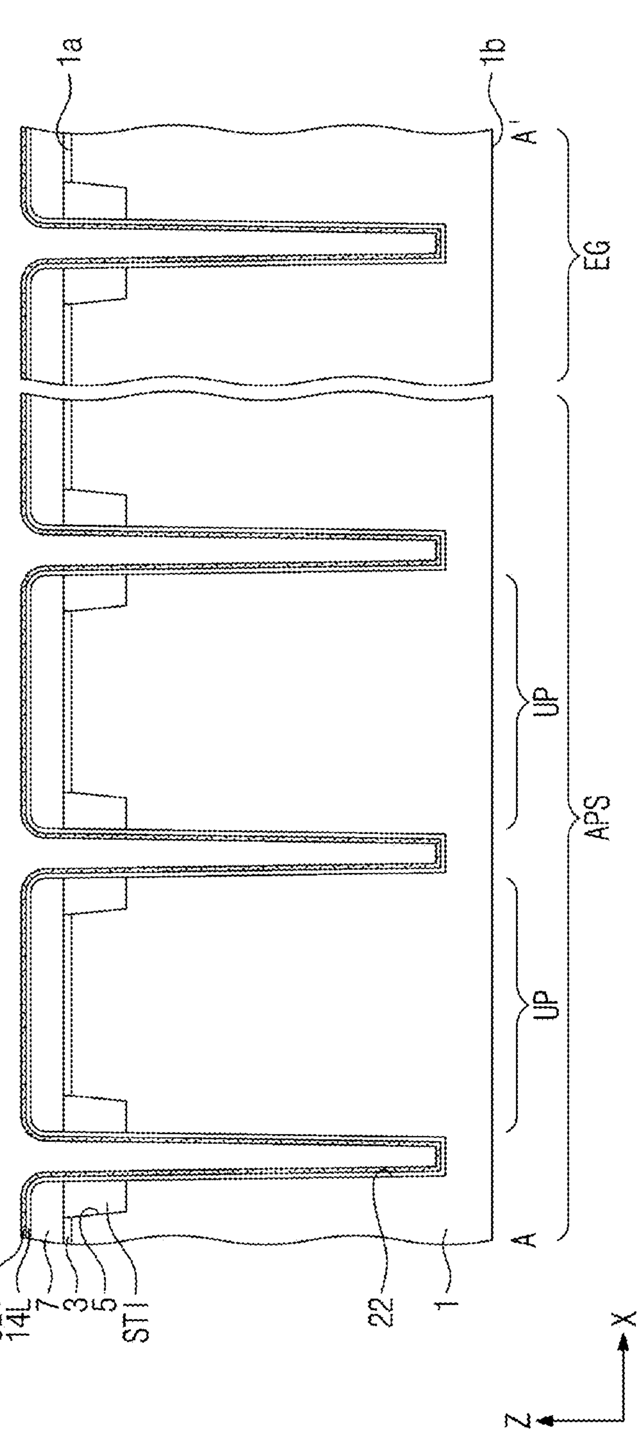
FIGS. 8A, 8B, 8C, 8D, 8E, and 8F are sectional views sequentially illustrating a method of fabricating an image sensor (e.g., having the sectional structure of FIG. 4).

Referring to FIGS. 7 and 8A, the first substrate 1 including the pixel array region APS and the edge region EG may be prepared. A first mask pattern 3 may be formed on the first surface 1*a* of the first substrate 1. The first mask pattern 3 may be formed of or include, for example, silicon oxide. The first mask pattern 3 on the first surface 1*a* may delimit positions of the active regions ACT. A second trench 5 may be formed by etching the first surface 1*a* of the first substrate 1 using the first mask pattern 3 as an etch mask.

A second mask pattern 7 may be formed on the first surface 1*a* of the first substrate 1. The second mask pattern 7 may be formed to cover the first mask pattern 3 and to fill a portion of the second trench 5. The second mask pattern 7 may define or delimit a position of a pixel isolation portion separating the unit pixels UP from each other. The second mask pattern 7 may be formed to expose a bottom surface of the second trench 5. The second mask pattern 7 may be formed of or include at least one of silicon oxide (SiO), silicon nitride (SiN), silicon carbon nitride (SiCN), or silicon oxycarbonitride (SiOCN) and may have a single- or multi-layered structure. The first trench 22 may be formed by etching the first substrate 1 using the second mask pattern 7 as an etch mask.

An insulating isolation layer 14L may be conformally formed on the first surface 1*a* of the first substrate 1 with the first trench 22 using, for example, an atomic layer deposition (ALD) method (in 51). The insulating isolation layer 14L may be formed of or include at least one of silicon oxide, silicon nitride, silicon oxynitride, or silicon carbonitride and may have a single- or multi-layered structure. In some example embodiments, before the formation of the insulating isolation layer 14L, a boron doping process may be performed on the first substrate 1 to form an impurity region around the first trench 22.

A first conductive layer SL1 may be formed on the insulating isolation layer 14L. The first conductive layer SL1 may be a semiconductor layer which contains impurities of a first conductivity type. As an example, a first silicon layer may be deposited on the insulating isolation layer 14L by a chemical vapor deposition process, which is performed at a first temperature. The first temperature may range from about 350° C. to 550° C. During the formation of the first silicon layer, impurities of the first or second conductivity type may be injected into the first silicon layer, or after the formation of the first silicon layer, an additional impurity injection process may be performed on the first silicon layer. The first silicon layer may be of an amorphous state, when the deposition process is finished, and may be crystallized by a first thermal treatment process to be described below.

Figure 8B:
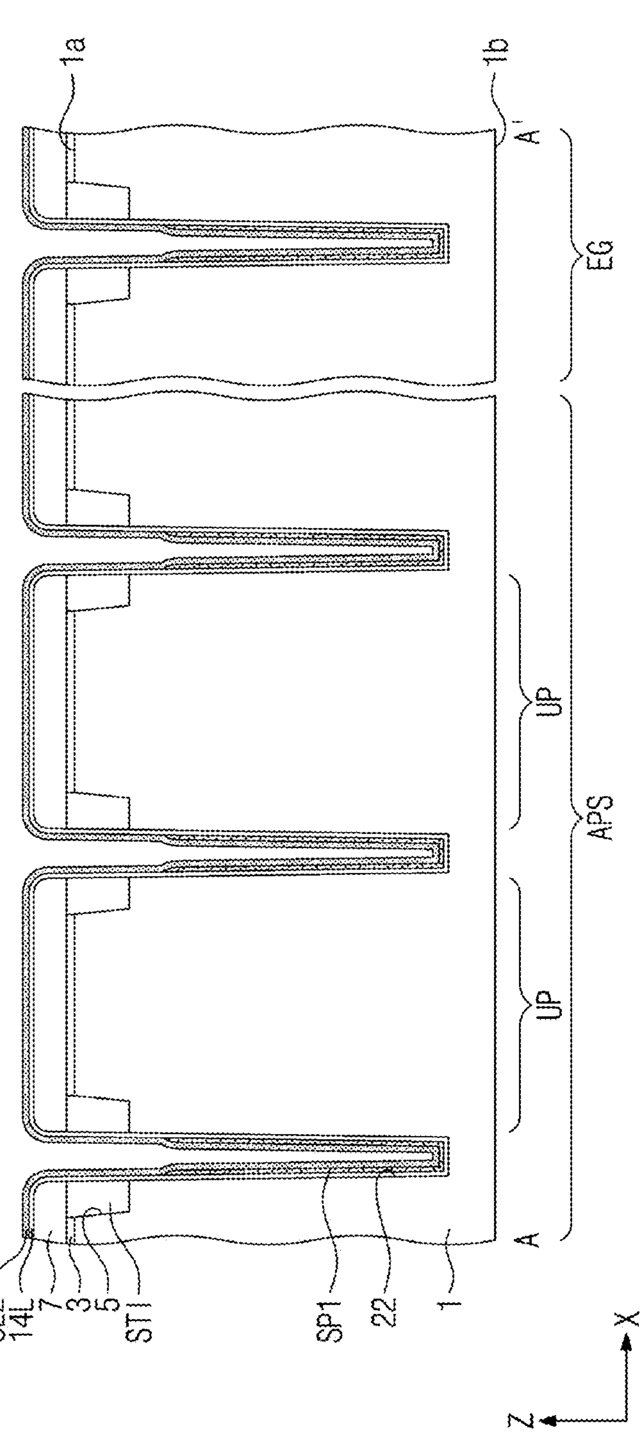

Referring to FIGS. 7 and 8B, a process of etching the first conductive layer SL1 may be performed to form the first conductive pattern SP1 (in S2). As an example, the formation of the first conductive pattern SP1 may include a wet etching process. The etching process may be performed to remove an upper portion of the first conductive layer SL1, and in this case, a portion of the insulating isolation layer 14L may be exposed to the outside.

A first thermal treatment process may be performed (in S3). The first conductive pattern SP1 may be crystallized by the first thermal treatment process. The first thermal treatment process may be performed at a temperature of about 700° C. to 900° C. In some example embodiments, the first thermal treatment process may be omitted, and in this case, the first conductive pattern SP1 may be crystallized during a process of forming the second and third conductive patterns SP2 and SP3.

A second conductive layer SL2 may be formed on the first conductive pattern SP1 (in S4). The second conductive layer SL2 may be an intrinsic semiconductor layer. As an example, a second silicon layer may be deposited on the first conductive pattern SP1 by a chemical vapor deposition process, which is performed at a second temperature. The second temperature may range from about 450° C. to 550° C. The second conductive layer SL2 may be in an amorphous state, when the deposition process is finished.

Figure 8C:
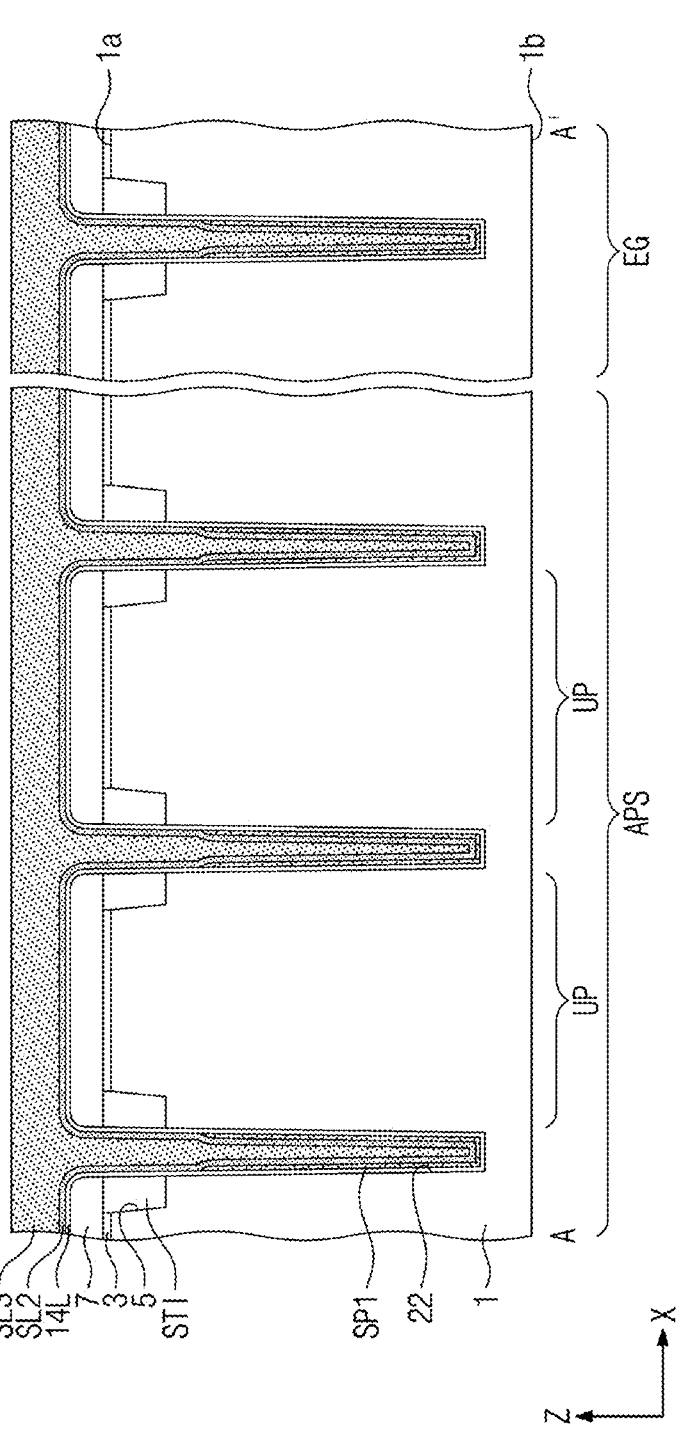

Referring to FIGS. 7 and 8C, a third conductive layer SL3 may be formed on the second conductive layer SL2 (in S5). The third conductive layer SL3 may fill the first trench 22. The third conductive layer SL3 may be an intrinsic semiconductor layer. As an example, a third silicon layer may be deposited on the second conductive layer SL2 by a chemical vapor deposition process, which is performed at a third temperature. The third temperature may be higher than the second temperature. As an example, the third temperature may range from about 570° C. to 670° C. Due to the relatively high deposition temperature, the third conductive layer SL3 may be formed to have a crystalline state. During the deposition of the third conductive layer SL3, the second conductive layer SL2 may be crystallized and may be grown to have a relatively large grain, compared with the third conductive layer SL3. The processes of forming the second and third conductive layers SL2 and SL3 may be successively performed in the same process chamber (i.e., in an in-situ manner).

Figure 8D:
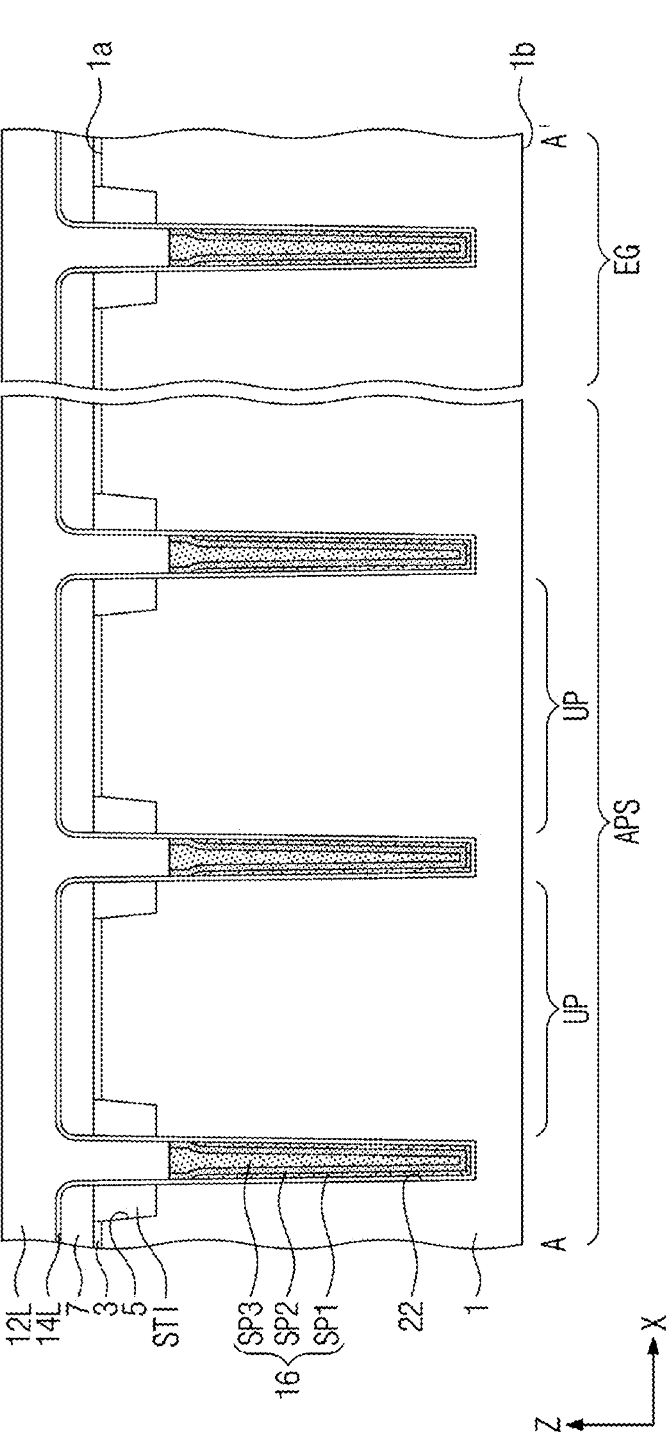

Referring to FIGS. 7 and 8D, the second and third conductive patterns SP2 and SP3 may be formed by performing an etch-back process on the second and third conductive layers SL2 and SL3 (in S6). As a result, the conductive pattern 16 including the first, second, and third conductive patterns SP1, SP2, and SP3 may be formed. An insulating gapfill layer 12L may be formed on the conductive pattern 16 to fill the first trench 22. In some example embodiments, the insulating gapfill layer 12L may be formed of or include silicon oxide. Thereafter, a second thermal treatment process may be performed (in S7). In some example embodiments, the second thermal treatment process may be omitted.

Figure 8E:
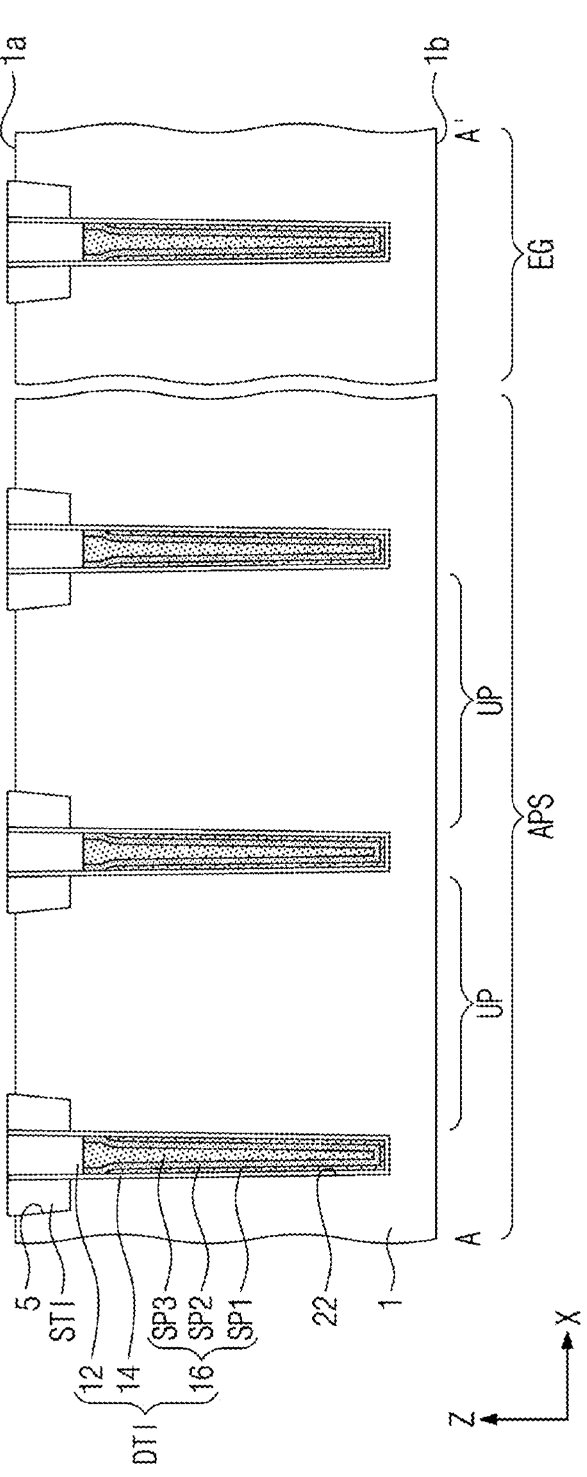

Referring to FIG. 8E, a chemical mechanical polishing (CMP) process may be performed to remove the second mask pattern 7, the insulating isolation layer 14L, and the insulating gapfill layer 12L on the first mask pattern 3 and to expose a surface of the first mask pattern 3. The insulating isolation pattern 14 may be formed from a portion of the insulating isolation layer 14L, and the insulating gapfill pattern 12 may be formed from a portion of the insulating gapfill layer 12L. The insulating gapfill pattern 12, the insulating isolation pattern 14, and the conductive pattern 16 may constitute the pixel isolation portion DTI. The pixel isolation portion DTI may delimit the unit pixels UP.

Figure 8F:
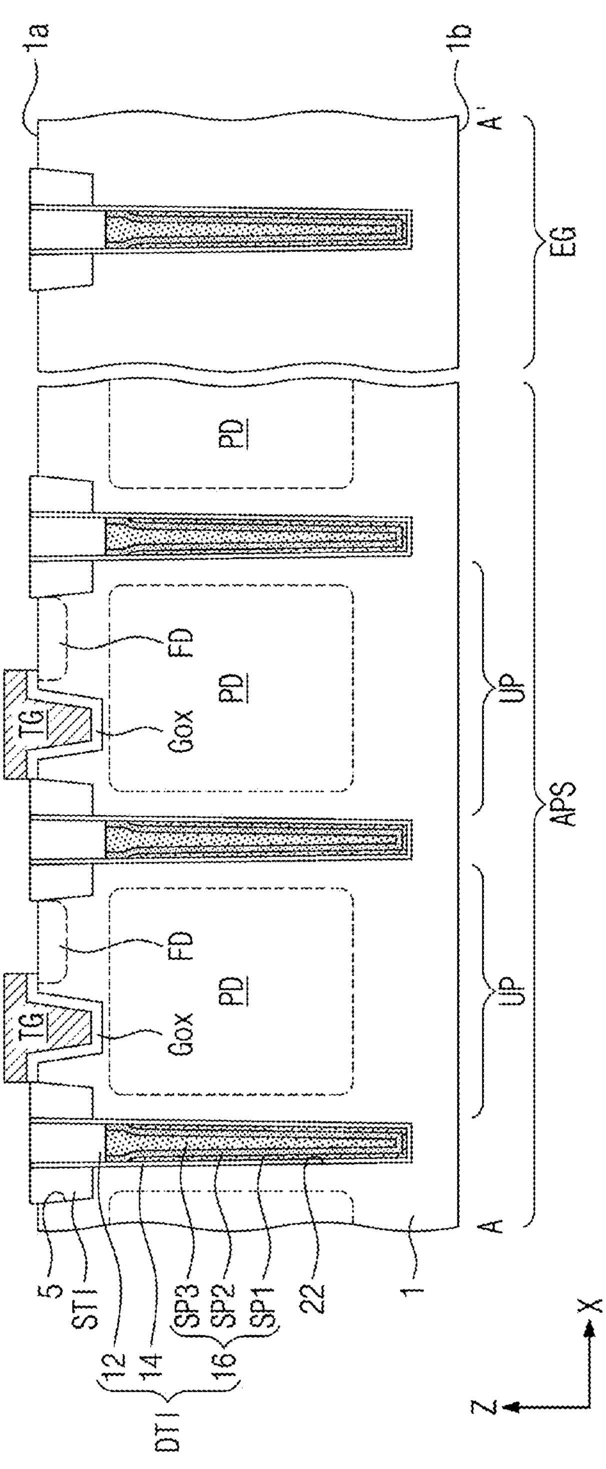

Referring to FIG. 8F, the first mask pattern 3 may be removed to expose the first surface 1*a* of the first substrate 1. The photoelectric conversion part PD may be formed by performing an ion implantation process on the first substrate 1. Forming the transfer gate TG, the gate insulating layer Gox, and the floating diffusion region FD on the first surface 1*a* of the first substrate 1. Other elements in FIGS. 3 to 5B may be formed through subsequent processes.

According to some example embodiments of the inventive concepts, since the second conductive pattern SP2 is formed at a relatively low temperature, it may be possible to improve a step coverage property of the second conductive pattern SP2. Thereafter, the third conductive pattern SP3 may be formed at a relatively high temperature, and in this case, a deposition rate may be increased. Accordingly, it may be possible to prevent or suppress a void from being formed in the pixel isolation portion DTI, thereby improving operational performance of the image sensor 500 that includes the DTI due to suppressed dark current in the image sensor 500 as a result of the image sensor 500 including the pixel isolation portion DTI including the first, second, and third conductive patterns SP1, SP2, and SP3 and the resultant reduction, minimization, prevention, or suppression of void formation in the pixel isolation portion DTI.

Figure 9:
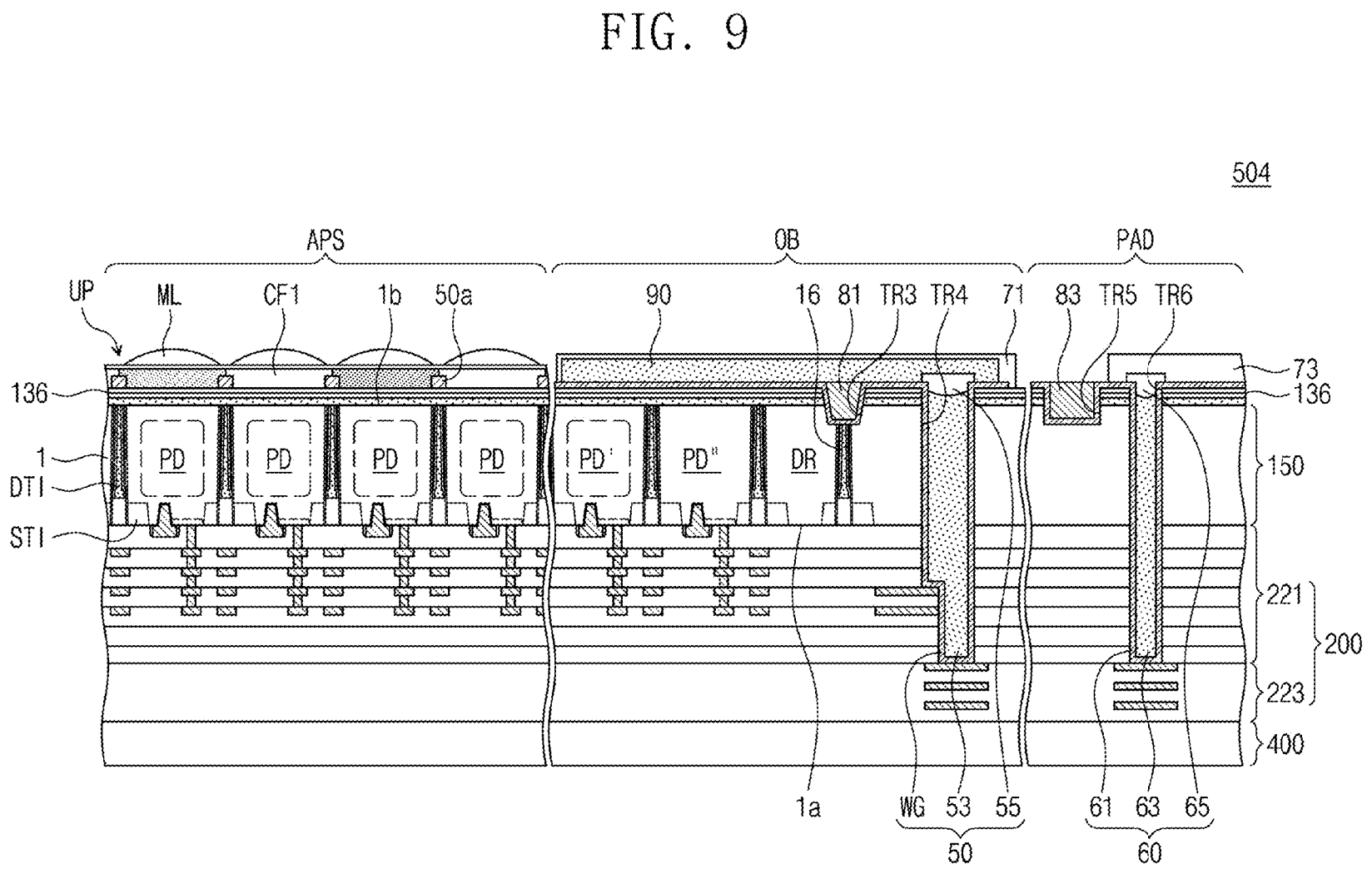

FIG. 9 is a sectional view illustrating an image sensor according to some example embodiments of the inventive concepts.

Referring to FIG. 9, an image sensor 504 according to some example embodiments of the inventive concepts may include the first substrate 1, which has the pixel array region APS, the optical black region OB, and a pad region PAD, an interconnection layer 200 on the first surface 1*a* of the first substrate 1, and a second substrate 400 on the interconnection layer 200. The interconnection layer 200 may include an upper interconnection layer 221 and a lower interconnection layer 223. The pixel array region APS may include a plurality of pixels UP. The pixels UP, which are disposed in the pixel array region APS, may be substantially the same as those described with reference to FIGS. 1 to 8.

In the optical black region OB, a first connection structure 50, a first conductive pad 81, and a bulk color filter 90 may be provided on the first substrate 1. The first connection structure 50 may include a first light-blocking pattern WG, an insulating pattern 53, and a first capping pattern 55.

The first light-blocking pattern WG may be provided on the second surface 1*b* of the first substrate 1. More specifically, the first light-blocking pattern WG may cover an insulating layer 136 on the second surface 1*b* and may conformally cover inner surfaces of third and fourth trenches TR3 and TR4. The first light-blocking pattern WG may penetrate a photoelectric conversion layer 150 and the upper interconnection layer 221 and may connect the photoelectric conversion layer 150 to the interconnection layer 200. More specifically, the first light-blocking pattern WG may be in contact with interconnection lines, which are placed in the upper and lower interconnection layers 221 and 223, and with the conductive pattern 16 of the pixel isolation portion DTI, which is placed in the photoelectric conversion layer 150. Accordingly, the first connection structure 50 may be electrically connected to the interconnection lines in the interconnection layer 200. The first light-blocking pattern WG may be formed of or include at least one of metallic materials (e.g., tungsten). The first light-blocking pattern WG may prevent light from being incident into the optical black region OB.

The first conductive pad 81 may be provided in the third trench TR3 to fill a remaining portion of the third trench TR3. The first conductive pad 81 may be formed of or include at least one of metallic materials (e.g., aluminum). The first conductive pad 81 may be connected to the conductive pattern 16. A negative bias voltage may be applied to the conductive pattern 16 through the first conductive pad 81. In this case, it may be possible to reduce, minimize, prevent or suppress a white spot issue or a dark current issue, thereby improving operational performance of the image sensor as a result of the image sensor 500 including the conductive pattern 16 including the first, second, and third conductive patterns SP1, SP2, and SP3 and the resultant reduction, minimization, prevention, or suppression of void formation in the pixel isolation portion DTI.

The insulating pattern 53 may fill a remaining portion of the fourth trench TR4. The insulating pattern 53 may be provided to penetrate the photoelectric conversion layer 150 and a portion or the entire portion of the interconnection layer 200. The first capping pattern 55 may be provided on a top surface of the insulating pattern 53. The first capping pattern 55 may be provided on the insulating pattern 53.

The bulk color filter 90 may be provided on the first conductive pad 81, the first light-blocking pattern WG, and the first capping pattern 55. The bulk color filter 90 may cover the first conductive pad 81, the first light-blocking pattern WG, and the first capping pattern 55. A first protection layer 71 may be provided on the bulk color filter 90 to hermetically seal the bulk color filter 90.

A photoelectric conversion part PD' and a dummy region DR may be provided in the optical black region OB of the first substrate 1. In some example embodiments, the photoelectric conversion part PD' may be doped with impurities, which are of a second conductivity type different from the first conductivity type. The second conductivity type may be, for example, an n-type. The pixel array region APS may include a plurality of unit pixels UP. The photoelectric conversion part PD' may have a similar structure to the photoelectric conversion part PD but may not perform the operation of converting light to electric signals, unlike the photoelectric conversion part PD. The dummy region DR may not be doped with impurities. A signal generated in the dummy region DR may be used as information for removing process noises, in a subsequent step.

In the pad region PAD, a second connection structure 60, a second conductive pad 83, and a second protection layer 73 may be provided on the first substrate 1. The second connection structure 60 may include a second light-blocking pattern 61, an insulating pattern 63, and a second capping pattern 65.

The second light-blocking pattern 61 may be provided on the second surface 1*b* of the first substrate 1. More specifically, the second light-blocking pattern 61 may cover the insulating layer 136 on the second surface 1*b* and may conformally cover inner surfaces of a fifth trench TR5 and a sixth trench TR6. The second light-blocking pattern 61 may be provided to penetrate the photoelectric conversion layer 150 and the upper interconnection layer 221 and to connect the photoelectric conversion layer 150 to the interconnection layer 200. More specifically, the second light-blocking pattern 61 may be in contact with the interconnection lines in the lower interconnection layer 223. Accordingly, the second connection structure 60 may be electrically connected to the interconnection lines in the interconnection layer 200. The second light-blocking pattern 61 may be formed of or include at least one of metallic materials (e.g., tungsten).

The second conductive pad 83 may be provided in the fifth trench TR5 to fill a remaining portion of the fifth trench TR5. The second conductive pad 83 may be formed of or include at least one of metallic materials (e.g., aluminum). The second conductive pad 83 may be used as a conduction path, which is used for electric connection to the outside of the image sensor. The insulating pattern 63 may fill a remaining portion of the sixth trench TR6. The insulating pattern 63 may be provided to penetrate the photoelectric conversion layer 150 and the entirety or at least a portion of the interconnection layer 200. The second capping pattern 65 may be provided on the insulating pattern 63. A second protection layer may be provided to cover a portion of the second light-blocking pattern 61 and the second capping pattern 65.

A current, which is applied through the second conductive pad 83, may flow the conductive pattern 16 of the pixel isolation portion DTI through the second light-blocking pattern 61, the interconnection lines in the interconnection layer 200, and the first light-blocking pattern WG. Electrical signals, which are generated from photoelectric conversion parts PD and PD' and the dummy region DR, may be transmitted to the outside through the interconnection lines in the interconnection layer 200, the second light-blocking pattern 61, and the second conductive pad 83.

Figure 10:
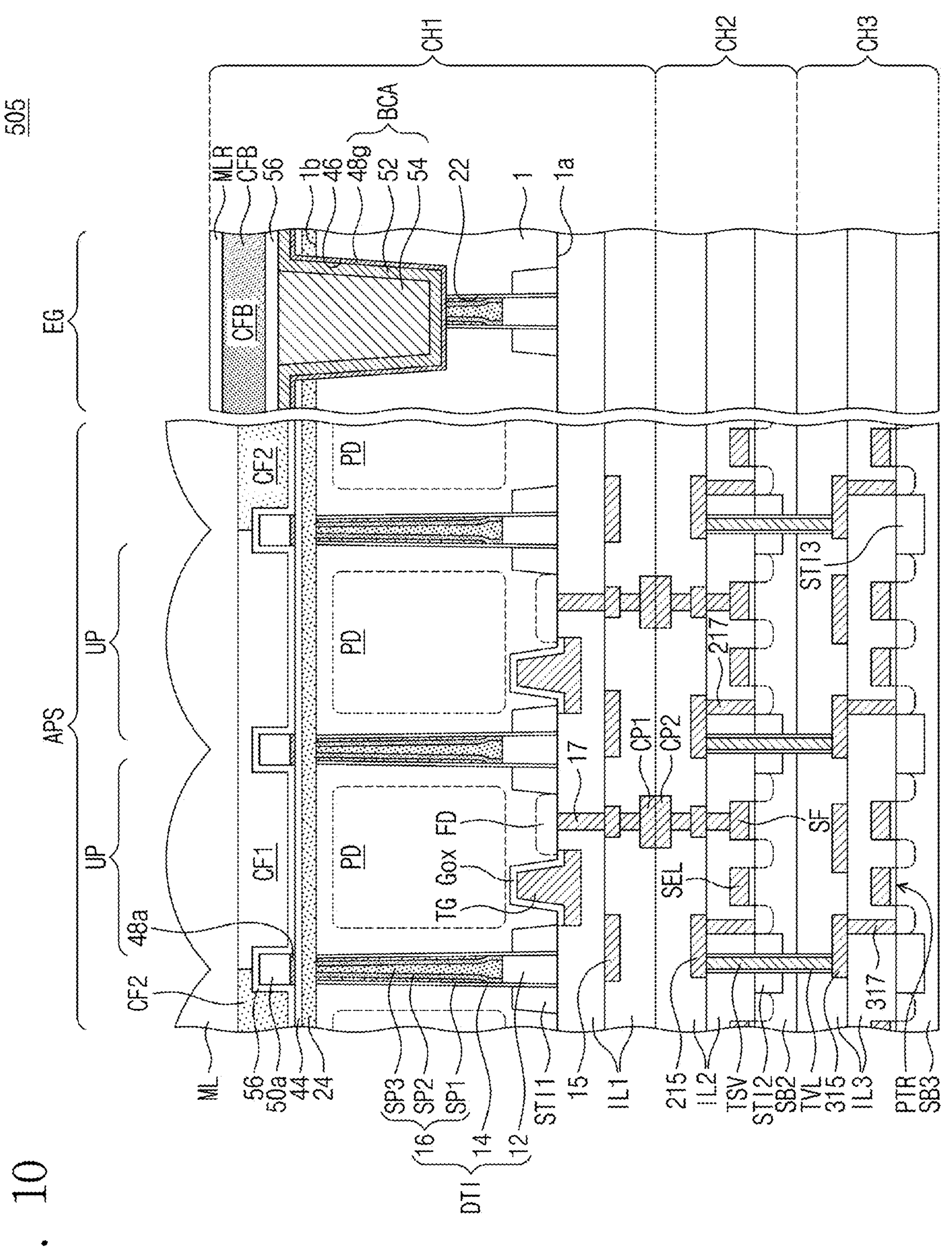
FIG. 10 is a sectional view illustrating an image sensor according to some example embodiments of the inventive concepts.

FIG. 10 is a sectional view illustrating an image sensor according to some example embodiments of the inventive concepts.

Referring to FIG. 10, an image sensor 505 may include first to third sub-chips CH1-CH3, which are sequentially bonded to each other. In some example embodiments, the first sub-chip CH1 may be configured to have an image sensing function. The first sub-chip CH1 may be configured to have the same or similar features as those described with reference to FIGS. 3 to 9. The first sub-chip CH1 may include the transfer gates TG, which are provided on the first surface 1*a* of the first substrate 1, and first interlayer insulating layers IL1 covering them. A first device isolation portion STI1 may be disposed in the first substrate 1 to define active regions. A first conductive pad CP1 may be disposed in the lowermost one of the first interlayer insulating layers ILL The first conductive pad CP1 may be formed of or include copper.

The second sub-chip CH2 may include a second substrate SB2, selection gates SEL, source follower gates SF, and reset gates (not shown), which are disposed on the second substrate SB2, and second interlayer insulating layers IL2 covering them. A second device isolation portion STI2 may be disposed in the second substrate SB2 to define active regions. Second contacts 217 and second interconnection lines 215 may be disposed in the second interlayer insulating layers IL2. A second conductive pad CP2 may be disposed in the uppermost one of the second interlayer insulating layers IL2. The second conductive pad CP2 may be formed of or include copper. The second conductive pad CP2 may be in contact with the first conductive pad CP1. The source follower gates SF may be connected to the floating diffusion regions FD of the first sub-chip CH1, respectively.

The third sub-chip CH3 may include a third substrate SB3, peripheral transistors PTR disposed on the third substrate SB3, and third interlayer insulating layers IL3 covering them. A third device isolation portion STI3 may be disposed in the third substrate SB3 to define active regions. Third contacts 317 and third interconnection lines 315 may be disposed in the third interlayer insulating layers IL3. The uppermost one of the third interlayer insulating layers IL3 may be in contact with the second substrate SB2. A penetration electrode TSV may be provided to penetrate the second interlayer insulating layer IL2, the second device isolation portion STI2, the second substrate SB2, and the third interlayer insulating layer IL3 and to connect the second interconnection line 215 to the third interconnection line 315. A sidewall of the penetration electrode TSV may be enclosed by a via insulating layer TVL. The third sub-chip CH3 may include circuits, which are used to drive the first and/or second sub-chip CH1 and/or CH2 or to store electrical signals that are generated by the first and/or second sub-chip CH1 and/or CH2.

In an image sensor according to some example embodiments of the inventive concepts, a pixel isolation portion may include a first conductive pattern, a second conductive pattern SP2, and a third conductive pattern, and a void may not be formed in a conductive pattern based on the pixel isolation portion including the first, second, and third conductive patterns SP1, SP2, and SP3 and the resultant reduction, minimization, prevention, or suppression of void formation in the pixel isolation portion DTI, for example based on the arrangement, the difference in thickness, and/or the difference in grain size between the first, second, and third conductive patterns SP1, SP2, and SP3. Accordingly, it may be possible to uniformly apply a negative bias in the pixel isolation portion, regardless of a position (e.g., without or substantially without variation of the negative bias in different positions in the conductive pattern 16), and thereby to reduce, minimize, prevent or suppress a dark current from occurring in an image sensor including a pixel isolation portion DTI that includes the conductive pattern 16. In addition, since a rear strength of a module in a product (e.g., a product including the image sensor) is increased for example based on the arrangement, the difference in thickness, and/or the difference in grain size between the first, second, and third conductive patterns SP1, SP2, and SP3 in the image sensor, a final yield of manufactured products that include image sensors in a manufacturing process may be increased, thereby improving performance and/or efficiency of a manufacturing process to manufacture image sensors comprising image sensors, based on a reduced likelihood of structural failure of the image sensor being manufactured in such a manufacturing process due to manufacturing defects.

While some example embodiments of the inventive concepts have been particularly shown and described, it will be understood by one of ordinary skill in the art that variations in form and detail may be made therein without departing from the spirit and scope of the attached claims. Furthermore, the inventive concepts may be realized by combining the elements in some example embodiments, including the example embodiments described with reference to FIGS. 3 to 10.

What is claimed is:

1. An image sensor, comprising:

a substrate having a first surface and a second surface, the first surface and the second surface being opposite to each other;

micro lenses on the second surface;

interconnection lines on the first surface; and a pixel isolation portion in the substrate, the pixel isolation portion configured to isolate pixels from direct contact with each other, wherein the pixel isolation portion includes an insulating isolation pattern and a conductive pattern, the conductive pattern being spaced apart from the substrate, and the insulating isolation pattern being between the substrate and the conductive pattern, and wherein the conductive pattern includes a sequential arrangement of a first semiconductive pattern, a second semiconductive pattern, and a third semiconductive pattern on a side surface of the insulating isolation pattern, the first semiconductive pattern being in contact with the insulating isolation pattern, and a thickness of the second semiconductive pattern being at least one of larger than a thickness of the first semiconductive pattern or smaller than a thickness of the third semiconductive pattern in a first direction parallel to the first surface.

2. The image sensor of claim 1, wherein a grain size of the second semiconductive pattern is larger than a grain size of the first semiconductive pattern.

3. The image sensor of claim 1, wherein the first semiconductive pattern comprises a polycrystalline semiconductor material containing impurities of a first conductivity type, and the second semiconductive pattern and the third semiconductive patterns comprise a substantially intrinsic polycrystalline semiconductor material.

4. The image sensor of claim 1, wherein a grain size of the second semiconductive pattern is about 2 times to about 4 times a grain size of the third semiconductive pattern.

5. The image sensor of claim 1, wherein a grain size of the second semiconductive pattern is larger than a grain size of the third semiconductive pattern.

6. The image sensor of claim 1, wherein a grain size of the second semiconductive pattern is about 1.5 times to about 6 times a grain size of the first semiconductive pattern.

7. The image sensor of claim 1, wherein, the thickness of the second semiconductive pattern is larger than the thickness of the first semiconductive pattern in the first direction.

8. The image sensor of claim 7, wherein the thickness of the third semiconductive pattern is larger than the thickness of the second semiconductive pattern in the first direction.

9. The image sensor of claim 1, wherein the pixel isolation portion further comprises an insulating gapfill pattern that is between the conductive pattern and the first surface.

10. The image sensor of claim 9, wherein a top surface of the insulating gapfill pattern is connected to the second semiconductive pattern and the third semiconductive patterns, the top surface of the insulating gapfill pattern being spaced apart from the first semiconductive pattern.

11. The image sensor of claim 1, further comprising a backside insulating layer between the pixel isolation portion and the micro lenses, wherein a top surface of the third semiconductive pattern is in contact with a bottom surface of the backside insulating layer.

12. An image sensor, comprising:

a substrate having a first surface and a second surface, the first surface and the second surface being opposite to each other;

micro lenses on the second surface;

interconnection lines on the first surface; and a pixel isolation portion in the substrate, the pixel isolation portion configured to isolate pixels from direct contact with each other, wherein the pixel isolation portion includes an insulating isolation pattern and a conductive pattern, the conductive pattern being spaced apart from the substrate, and the insulating isolation pattern being between the substrate and the conductive pattern, wherein the conductive pattern comprises a sequential arrangement of an outer semiconductive pattern and an inner semiconductive pattern on a side surface of the insulating isolation pattern, wherein the outer semiconductive pattern includes a polycrystalline semiconductor layer containing impurities of a first conductivity type, wherein the inner semiconductive pattern includes a substantially intrinsic polycrystalline semiconductor layer, and wherein a grain size of the inner semiconductive pattern is larger than a grain size of the outer semiconductive pattern.

13. The image sensor of claim 12, wherein a grain size of the inner semiconductive pattern is larger at a position close to the outer semiconductive pattern than at a position far from the outer semiconductive pattern.

14. The image sensor of claim 13, wherein the outer semiconductive pattern comprises a first semiconductive pattern, the inner semiconductive pattern comprises a second semiconductive pattern and a third semiconductive pattern, the third semiconductive pattern being spaced apart from the first semiconductive pattern, and the second semiconductive pattern being between the first semiconductive pattern and the third semiconductive pattern, and a grain size of the second semiconductive pattern is larger than a grain size of the third semiconductive pattern.

15. The image sensor of claim 14, wherein the grain size of the second semiconductive pattern is about 2 times to about 4 times the grain size of the third semiconductive pattern.

16. The image sensor of claim 14, wherein a grain size of the first semiconductive pattern is smaller than the grain size of the second semiconductive pattern.

17. The image sensor of claim 16, wherein the grain size of the second semiconductive pattern is about 1.5 times to about 6 times the grain size of the first semiconductive pattern.

18. The image sensor of claim 14, wherein, a thickness of the second semiconductive pattern is larger than a thickness of the first semiconductive pattern in a first direction parallel to the first surface.

19. An image sensor, comprising:

a substrate having a first surface and a second surface, the first surface and the second surface being opposite to each other, and the substrate including a clockwise arrangement of first to fourth pixels;

a backside insulating layer in contact with the second surface;

a transfer gate on the first surface of the substrate, in each of the first to fourth pixels;

micro lenses on the second surface;

an interlayer insulating layer covering the first surface of the substrate;

interconnection lines in the interlayer insulating layer; and a pixel isolation portion in the substrate and between the first to fourth pixels, the pixel isolation portion configured to isolate the first to fourth pixels from direct contact with each other, wherein the pixel isolation portion includes an insulating isolation pattern and a conductive pattern, the conductive pattern being spaced apart from the substrate, and the insulating isolation pattern being between the substrate and the conductive pattern, wherein the conductive pattern includes a sequential arrangement of a first semiconductive pattern, a second semiconductive pattern, and a third semiconductive pattern on a side surface of the insulating isolation pattern, and wherein a grain size of the second semiconductive pattern is larger than a grain size of the third semiconductive pattern.

* * * * *